(12) United States Patent  
Jin et al.

(10) Patent No.: US 8,561,707 B2  
(45) Date of Patent: *Oct. 22, 2013

(54) ULTRA-LOW FRICTION COATINGS FOR DRILL STEM ASSEMBLIES

(75) Inventors: Hyun Woo Jin, Easton, PA (US); Srinivasan Rajagopalan, Easton, PA (US); Adnan Ozekcin, Bethlehem, PA (US); Tabassumul Haque, Annandale, NJ (US); Mehmet Deniz Ertas, Bethlehem, PA (US); Bo Zhao, Houston, TX (US); Jeffrey Roberts Bailey, Houston, TX (US); Terris Field Walker, Cypress, TX (US)

(73) Assignee: ExxonMobil Research and Engineering Company, Annandale, NJ (US)

( * ) Notice: Subject to any disclaimer, the term of this patent is extended or adjusted under 35 U.S.C. 154(b) by 329 days.

This patent is subject to a terminal disclaimer.

(21) Appl. No.: 13/042,761

(22) Filed: Mar. 8, 2011

(65) Prior Publication Data

US 2011/0220415 A1 Sep. 15, 2011

Related U.S. Application Data

(63) Continuation-in-part of application No. 12/583,292, filed on Aug. 18, 2009, now Pat. No. 8,220,563.

(51) Int. Cl.  
*E21B 17/10* (2006.01)

(52) U.S. Cl.  
USPC ............... 166/380; 166/242.4; 166/902

(58) Field of Classification Search  
USPC ............... 166/380, 902, 242.4; 175/226  
See application file for complete search history.

(56) References Cited

U.S. PATENT DOCUMENTS 7,150,324 B2 * 12/2006 Laursen et al. ............... 166/355

* cited by examiner

*Primary Examiner* — William P Neuder  
(74) *Attorney, Agent, or Firm* — Robert A. Migliorini

(57) ABSTRACT

Provided are drill stem assemblies with ultra-low friction coatings for subterranean drilling operations. In one form, the coated drill stem assemblies for subterranean rotary drilling operations include a body assembly with an exposed outer surface including a drill string coupled to a bottom hole assembly, a coiled tubing coupled to a bottom hole assembly, or a casing string coupled to a bottom hole assembly and an ultra-low friction coating on at least a portion of the exposed outer surface of the body assembly, hardbanding on at least a portion of the exposed outer surface of the body assembly, an ultra-low friction coating on at least a portion of the hardbanding, wherein the ultra-low friction coating comprises one or more ultra-low friction layers, and one or more buttering layers interposed between the hardbanding and the ultra-low friction coating. The coated drill stem assemblies disclosed herein provide for reduced friction, vibration (stick-slip and torsional), abrasion, and wear during straight hole or directional drilling to allow for improved rates of penetration and enable ultra-extended reach drilling with existing top drives.

140 Claims, 15 Drawing Sheets

ULTRA-LOW FRICTION COATINGS FOR DRILL STEM ASSEMBLIES

CROSS-REFERENCE TO RELATED APPLICATIONS

This application is a Continuation-in-Part of U.S. patent application Ser. No. 12/583,292, filed Aug. 18, 2009, and claims priority of U.S. Provisional Application Ser. No. 61/189,530, filed Aug. 20, 2008; the contents of each are hereby incorporated by reference.

FIELD

The present disclosure relates to the field of rotary drilling. It more particularly relates to ultra-low friction coatings and the use of such coatings on drill stem assemblies to reduce friction and wear during subterranean rotary drilling operations.

BACKGROUND

In rotary drilling operations, a drill bit is attached to the end of a bottom hole assembly which is attached to a drill string comprising drill pipe and tool joints which may be rotated at the surface by a rotary table or top drive unit. The weight of the drill string and bottom hole assembly causes the rotating bit to bore a hole in the earth. As the operation progresses, new sections of drill pipe are added to the drill string to increase its overall length. Periodically during the drilling operation, the open borehole is cased to stabilize the walls, and the drilling operation is resumed. As a result, the drill string usually operates both in the open borehole and within the casing which has been installed in the borehole. Alternatively, coiled tubing may replace drill string in the drilling assembly. The combination of a drill string and bottom hole assembly or coiled tubing and bottom hole assembly is referred to herein as a drill stem assembly. Rotation of the drill string provides power through the drill string and bottom hole assembly to the bit. In coiled tubing drilling, power is delivered to the bit by the drilling fluid pumps. The amount of power which can be transmitted by rotation is limited to the maximum torque a drill string or coiled tubing can sustain.

During the drilling of a borehole through underground formations, the drill stem assembly undergoes considerable sliding contact with both the steel casing and rock formations. This sliding contact results primarily from the rotational and axial movements of the drill stem assembly in the borehole. Friction between the moving surface of the drill stem assembly and the stationary surfaces of the casing and formation creates considerable drag on the drill stem and results in excessive torque and drag during drilling operations. The problem caused by friction is inherent in any drilling operation, but it is especially troublesome in directionally drilled wells or extended reach drilling (ERD) wells. Directional drilling or ERD is the intentional deviation of a wellbore from the vertical. In some cases the angle from the vertical may be as great as ninety degrees from the vertical. Such wells are commonly referred to as horizontal wells and may be drilled to a considerable depth and considerable distance from the drilling platform.

In all drilling operations, the drill stem assembly has a tendency to rest against the side of the borehole or the well casing, but this tendency is much greater in directionally drilled wells because of the effect of gravity. As the drill string increases in length or degree of vertical deflection, the amount of friction created by the rotating drill stem assembly also increases. To overcome this increase in friction, additional power is required to rotate the drill stem assembly. In some cases, the friction between the drill stem assembly and the casing wall or borehole exceeds the maximum torque that can be tolerated by the drill stem assembly and/or maximum torque capacity of the drill rig and drilling operations must cease. Consequently, the depth to which wells can be drilled using available directional drilling equipment and techniques is limited.

One method for reducing the friction caused by the contact between the drill stem assembly and casing (in case of a cased hole) or borehole (in case of an open hole) is improving the lubricity of drilling muds. In industry drilling operations, attempts have been made to reduce friction through, mainly, using water and/or oil based mud solutions containing various types of expensive and often environmentally unfriendly additives. Diesel and other mineral oils are also often used as lubricants, but there is a problem with the disposal of the mud. Certain minerals such as bentonite are known to help reduce friction between the drill stem assembly and an open borehole. Materials such as Teflon have been used to reduce friction, however these lack durability and strength. Other additives include vegetable oils, asphalt, graphite, detergents and walnut hulls, but each has its own limitations.

Another method for reducing the friction between the drill stem assembly and the well casing or borehole is to use aluminum drill string because aluminum is lighter than steel. However, the aluminum drill string is expensive and is difficult to use in drilling operations, and it is not compatible with many types of drilling fluids (e.g. drilling fluids with high pH).

Yet another method for reducing the friction between the drill stem assembly and the well casing or borehole is to use a hard facing material on the drill string assembly (also referred to herein as hardbanding or hardfacing). U.S. Pat. No. 4,665,996, herein incorporated by reference in its entirety, discloses the use of hardfacing the principal bearing surface of a drill pipe with an alloy having the composition of: 50-65% cobalt, 25-35% molybdenum, 1-18% chromium, 2-10% silicon and less than 0.1% carbon for reducing the friction between the drill string and the casing or rock. As a result, the torque needed for the rotary drilling operation, especially directional drilling, is decreased. The disclosed alloy also provides excellent wear resistance on the drill string while reducing the wear on the well casing. Another form of hardbanding is WC-cobalt cermets applied to the drill stem assembly. Other hardbanding materials include TiC, Cr-carbide, Nb-carbide and other mixed carbide, carbonitride, boride and nitride systems. Hardbanding may be applied to portions of the drill stem assembly using weld overlay or thermal spray methods.

U.S. Patent Publication No. 2002/0098298 discloses hardbanding applied in a pattern on the surface of a tool joint for the purpose of reducing hydraulic drag. "By providing wear-reducing material in separate, defined spaced-apart areas, fluid flow in a wellbore annulus past a tool joint is enhanced, i.e. flow between deposit areas is facilitated." This reference further discloses low friction materials wherein the low friction material is a component element of the hardbanding material such as chromium. "The minimal admixture of the base material permits an extremely accurate pre-engineering of the matrix chemistry, allowing customization of the material and tailoring the tool joint to address drilling needs, such as severe abrasion, erosion, and corrosion, as seen, e.g., in open hole drilling conditions. It also permits modification of the deposit to adjust to coefficient of friction needs in metal-to-metal friction, e.g. as encountered in rotation of the drill string within the casing. In certain aspects the deposited material is modified by replacing galling material, e.g., iron and nickel, with non-galling elements, such as e.g., but not limited to, molybdenum, cobalt and chromium and combinations thereof."

U.S. Pat. No. 5,010,225 discloses the use of grooves in the hardbanding to prevent casing wear. The protruding area is free of tungsten carbide particles so that tungsten carbide particle contact with the casing is avoided. The recessed area is about 80% of the total surface area.

U.S. Pat. Nos. 7,182,160, 6,349,779 and 6,056,073 disclose the designs of grooved segments in drill strings for the purpose of improving fluid flow in the annulus and reducing contact and friction with the borehole wall.

In addition to hardbanding on tool joints, certain sleeved devices have been used in the industry. A polymer-steel based wear device is disclosed in U.S. Pat. No. 4,171,560 (Garrett, "Method of Assembling a Wear Sleeve on a Drill Pipe Assembly"). Western Well Tool subsequently developed and currently offers Non-Rotating Protectors to control contact between pipe and casing in deviated wellbores, the subject of U.S. Pat. Nos. 5,803,193, 6,250,405, and 6,378,633.

Strand et al. have patented a metal "Wear Sleeve" device (U.S. Pat. No. 7,028,788) that is a means to deploy hardbanding material on removable sleeves. This device is a ring that is typically of less than one-half inch in wall thickness that is threaded onto the pin connection of a drill pipe tool joint over a portion of the pin that is of reduced diameter, up to the bevel diameter of the connection. The ring has internal threads over a portion of the inner surface that are of left-hand orientation, opposite to that of the tool joint. Threaded this way, the ring does not bind against the pin connection body, but instead it drifts down to the box-pin connection face as the drill string turns to the right. Arnco markets this device under the trade name "WearSleeve." After several years of availability in the market and at least one field test, this system has not been used widely.

Arnco has devised a fixed hardbanding system typically located in the middle of a joint of drill pipe as described in U.S. Patent Publication No. 2007/0209839, "System and Method for Reducing Wear in Drill Pipe Sections."

Separately, a tool joint configuration in which the pin connection is held in the slips has been deployed in the field, as opposed to the standard petroleum industry configuration in which the box connection is held by the slips. Certain benefits have been alleged, as documented in exemplary publications SPE 18667 (1989) Dudman, R. A. et. al, "Pin-up Drillstring Technology: Design, Application, and Case Histories," and SPE 52848 (1999) Dudman, R. A. et. al, "Low-Stress Level Pin Up Drill string Optimizes Drilling of 20,000 ft Slim-Hole in Southern Oklahoma." Dudman discloses larger pipe diameters and connection sizes for certain hole sizes than may be used in the standard pin-down convention, because the pin connection diameter can be made smaller than the box connection diameter and still satisfy fishing requirements.

Still another problem encountered during subterranean rotary drilling operations, especially directional drilling, is the wear on the casing and drill stem assembly that occurs when the metal surfaces contact each other. This abrasion between metal surfaces during the drilling of oil and gas wells results in excessive wear on both the drill stem assembly and the well casing. Presently, one preferred solution to reduce wear of drill stem assemblies is to hardface portions of the drill stem assembly. A tungsten carbide containing alloy, such as Stellite 6 and Stellite 12 (trademark of Cabot Corporation), has excellent wear resistance as a hardfacing material. Hardfacing protects the drill stem assembly, but it tends to cause excessive abrading of the well casing. This problem is especially severe during directional drilling because the drill stem assembly, which has a tendency to rest on the well casing, continually abrades the well casing as the drill string rotates. In addition, some of these hardfacing alloys, such as tungsten carbide, may make the friction problem worse.

OTHER RELATED ART

In addition to the prior art disclosed above, U.S. Patent Publication No. 2008/0236842, "Downhole Oilfield Apparatus Comprising a Diamond-Like Carbon Coating and Methods of Use," discloses applicability of DLC coatings to downhole devices with internal surfaces that are exposed to the downhole environment.

Saenger and Desroches describe in EP 2090741 A1 a "coating on at least a portion of the surface of a support body" for downhole tool operation. The types of coatings that are disclosed include DLC, diamond carbon, and Cavidur (a proprietary DLC coating from Bekaert). The coating is specified as "an inert material selected for reducing friction." Specific applications to logging tools and O-rings are described. Specific benefits that are cited include friction and corrosion reduction.

Van Den Brekel et al. disclose in WO2008/138957 A2 a drilling method in which the casing material is 1 to 5 times harder than the drill string material, and friction reducing additives are used in the drilling fluid. The drill string may have poly-tetra-fluor-ethene (PTFE) applied as a friction-reducing outer layer.

Wei et al. also discloses the use of coatings on the internal surfaces of tubular structures (U.S. Pat. No. 6,764,714, "Method for Depositing Coatings on the Interior Surfaces of Tubular Walls," and U.S. Pat. No. 7,052,736, "Method for Depositing Coatings on the Interior Surfaces of Tubular Structures"). Tudhope et al. also have developed means to coat internal surfaces of an object, including for example U.S. Pat. No. 7,541,069, "Method and System for Coating Internal Surfaces Using Reverse-Flow Cycling."

Griffo discloses the use of superabrasive nanoparticles on bits and bottom-hole assembly components in U.S. Patent Publication No. 2008/0127475, "Composite Coating with Nanoparticles for Improved Wear and Lubricity in Downhole Tools."

Gammage et al. discloses spray metal application to the external surface of downhole tool components in U.S. Pat. No. 7,487,840.

Thornton discloses the use of Tungsten Disulphide ($WS_2$) on downhole tools in WO 2007/091054, "Improvements In and Relating to Downhole Tools."

The use of coatings on bits and bit seals has been disclosed, for example in U.S. Pat. No. 7,234,541, "DLC Coating for Earth-Boring Bit Seal Ring," U.S. Pat. No. 6,450,271, "Surface Modifications for Rotary Drill Bits," and U.S. Pat. No. 7,228,922, "Drill Bit."

In addition, the use of DLC coatings in non-oilfield applications has been disclosed in U.S. Pat. No. 6,156,616, "Synthetic Diamond Coatings with Intermediate Bonding Layers and Methods of Applying Such Coatings" and U.S. Pat. No. 5,707,717, "Articles Having Diamond-Like Protective Film."

U.S. Pat. No. 6,087,025 discloses the application of diamond-like carbon coatings to cutting surfaces of metal cutting tools. It also discloses metal working tools with metal working surfaces bearing a coating of diamond-like carbon that is strongly adhered to the surface via the following gradient: metal alloy or cobalt-cemented tungsten carbide base; cobalt or metal silicide and/or cobalt or metal germanide;

silicon and/or germanium; silicon carbide and/or germanium carbide; and, diamond-like carbon.

GB-454,743 discloses the application of binary, graded TiCr coatings on metallic substrates. More specifically, the coating disclosed preferably comprises either a layer of TiCr with a substantially constant composition or a graded TiCr layer, e.g. a base layer (adhesion layer) of Cr and a layer of graded composition consisting of Cr and Ti with the proportion of Ti in the layer increasing from the interface with the base layer to a proportion of Ti greater than that of Cr at the boundary of the graded layer remote from the base layer.

U.S. Pat. No. 5,989,397 discloses an apparatus and method for generating graded layers in a coating deposited on a metallic substrate. More specifically, it discloses a process control scheme for generating graded multilayer films repetitively and consistently using both pulsed laser sputtering and magnetron sputtering deposition techniques as well as an apparatus which allows for set up of an ultrahigh vacuum in a vacuum chamber automatically, and then execution of a computer algorithm or "recipe" to generate desired films. Software operates and controls the apparatus and executes commands which control digital and analog signals which control instruments.

In a recent development, drilling operations using casing or liners in the drill stem assembly has been used for various purposes, including eliminating the risk associated with the time delay to run the pipe in the hole. After completing the drilling of the interval, the bit and BHA may optionally be removed (depending on the specific casing drilling equipment configuration), and then the casing can be cemented in the borehole. Two representative industry papers on this subject include: "Running Casing on Conventional Wells with Casing Drilling™ Technology," T. M. Warren, et al., Petroleum Society 2004-183; and "Directional Drilling with Casing," T. M. Warren et al., SPE 79914.

Need for the Current Disclosure

Hence, there is a need for new coating/material technologies that are casing-friendly while protecting the drill stem assembly from wear and at the same time lowering contact friction in cased hole drilling conditions. This requires novel materials that combine high hardness with a capability for low coefficient of friction (COF) when in contact with the casing steel surface. If such coating/material can also provide a low energy surface and low COF against borehole wall, then that may be an enabler for ultra-extended reach drilling.

SUMMARY

According to the present disclosure, an advantageous coated drill stem assembly for subterranean rotary drilling operations comprises: a body assembly with an exposed outer surface including a drill string coupled to a bottom hole assembly, a coiled tubing coupled to a bottom hole assembly, or a casing string coupled to a bottom hole assembly, hardbanding on at least a portion of the exposed outer surface of the body assembly, an ultra-low friction coating on at least a portion of the hardbanding, wherein the ultra-low friction coating comprises one or more ultra-low friction layers, and one or more buttering layers interposed between the hardbanding and the ultra-low friction coating.

A further aspect of the present disclosure relates to an advantageous method for reducing friction in a coated drill stem assembly during subterranean rotary drilling operations comprising: providing a coated drill stem assembly comprising a body assembly with an exposed outer surface including a drill string coupled to a bottom hole assembly, a coiled tubing coupled to a bottom hole assembly, or a casing string coupled to a bottom hole assembly, hardbanding on at least a portion of the exposed outer surface of the body assembly, and an ultra-low friction coating on at least a portion of the hardbanding, wherein the ultra-low friction coating comprises one or more ultra-low friction layers, and one or more buttering layers interposed between the hardbanding and the ultra-low friction coating, and utilizing the coated drill stem assembly in subterranean rotary drilling operations.

A still further aspect of the present disclosure relates to an advantageous coated drill stem assembly for subterranean rotary drilling operations comprising: a body assembly with an exposed outer surface including a drill string coupled to a bottom hole assembly, a coiled tubing coupled to a bottom hole assembly, or a casing string coupled to a bottom hole assembly, an ultra-low friction coating on at least a portion of the body assembly, wherein the ultra-low friction coating comprises one or more ultra-low friction layers, and one or more buttering layers interposed between the body assembly and the ultra-low friction coating, wherein at least one of the buttering layers has a minimum hardness of 400 VHN.

A still yet further aspect of the present disclosure relates to an advantageous method for reducing friction in a coated drill stem assembly during subterranean rotary drilling operations comprising: providing a drill stem assembly comprising a body assembly with an exposed outer surface including a drill string coupled to a bottom hole assembly, a coiled tubing coupled to a bottom hole assembly, or a casing string coupled to a bottom hole assembly, an ultra-low friction coating on at least a portion of the body assembly, wherein the ultra-low friction coating comprises one or more ultra-low friction layers, and one or more buttering layers interposed between the body assembly and the ultra-low friction coating, wherein at least one of the buttering layers has a minimum hardness of 400 VHN, and utilizing the coated drill stem assembly in subterranean rotary drilling operations.

These and other features and attributes of the disclosed coated drill stem assembly, methods for reducing friction in a coated drill stem assembly for subterranean rotary drilling operations, and their advantageous applications and/or uses will be apparent from the detailed description which follows, particularly when read in conjunction with the figures appended hereto.

BRIEF DESCRIPTION OF DRAWINGS

To assist those of ordinary skill in the relevant art in making and using the subject matter hereof, reference is made to the appended drawings, wherein.

DEFINITIONS

Figure 1:
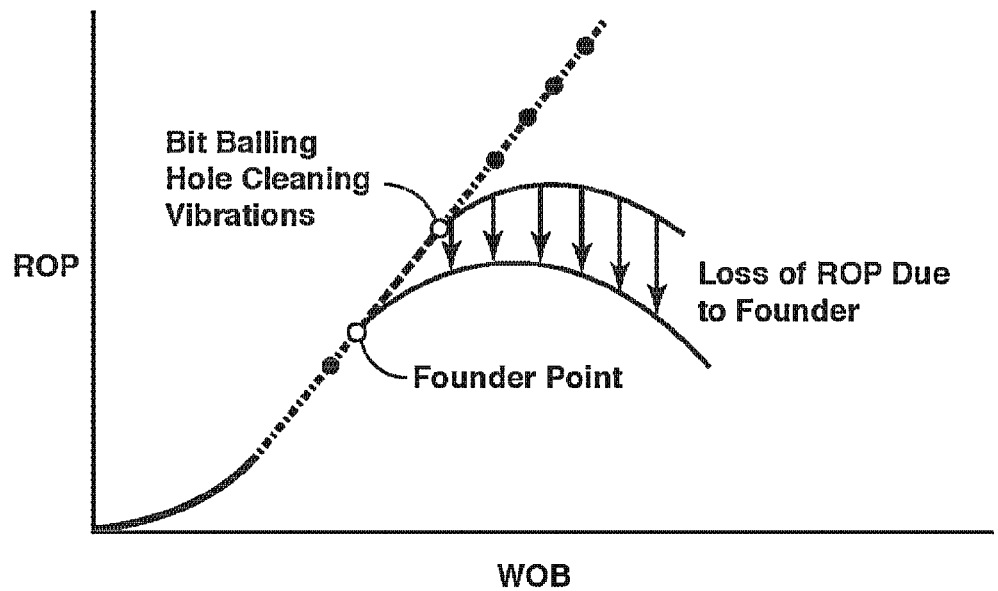
FIG. 1 depicts, schematically, the rate of penetration (ROP) versus weight on bit (WOB) during subterranean rotary drilling.

Drill string is defined as the column, or string of drill pipe with attached tool joints, transition pipe between the drill string and bottom hole assembly including tool joints, heavy weight drill pipe including tool joints and wear pads that transmits fluid and rotational power from the kelly to the drill collars and the bit. Often, especially in the oil patch, the term is loosely applied to include both drill pipe and drill collars. The drill string does not include the drill bit.

Drill stem is defined as the entire length of tubular pipes, composed of the kelly, the drill pipe, and drill collars, that make up the drilling assembly from the surface to the bottom of the hole. The drill stem does not include the drill bit. Recently, in an innovative development, the industry has used casing and liner tubulars in the drill stem assembly.

Bottom hole assembly (BHA) is defined as one or more components, including but not limited to: stabilizers, variable-gauge stabilizers, back reamers, drill collars, flex drill collars, rotary steerable tools, roller reamers, shock subs, mud motors, logging while drilling (LWD) tools, measuring while drilling (MWD) tools, coring tools, under-reamers, hole openers, centralizers, turbines, bent housings, bent motors, drilling jars, acceleration jars, crossover subs, bumper jars, torque reduction tools, float subs, fishing tools, fishing jars, washover pipe, logging tools, survey tool subs, non-magnetic counterparts of these components, associated external connections of these components, and combinations thereof.

Drill stem assembly is defined as a combination of a drill string and bottom hole assembly, a coiled tubing and bottom hole assembly, or a casing string and bottom hole assembly. The drill stem assembly does not include the drill bit.

A "coating" is comprised of one or more adjacent layers and any included interfaces. A coating may be placed on the base substrate material of a body assembly, on the hardbanding placed on a base substrate material, or on another coating.

An "ultra-low friction coating" is a coating for which the coefficient of friction is less than 0.15 under reference conditions.

A "layer" is a thickness of a material that may serve a specific functional purpose such as reduced coefficient of friction, high stiffness, or mechanical support for overlying layers or protection of underlying layers.

An "ultra-low friction layer" is a layer that provides low friction in an ultra-low friction coating.

A "non-graded layer" is a layer in which the composition, microstructure, physical, and mechanical properties are substantially constant through the thickness of the layer.

A "graded layer" is a layer in which at least one constituent, element, component, or intrinsic property of the layer changes over the thickness of the layer or some fraction thereof.

A "buffer layer" is a layer interposed between two or more ultra-low friction layers or between an ultra-low friction layer and buttering layer or hardbanding. There may be one or more buffer layers included within the ultra-low friction coating. A buffer layer may also be known as an "interlayer" or an "adhesive layer."

A "buttering layer" is a layer interposed between the outer surface of the body assembly substrate material or hardbanding and a layer, which may be another buttering layer, a buffer layer, or an ultra-low friction layer. There may be one or more buttering layers interposed in such a manner.

"Hardbanding" is a layer interposed between the outer surface of the body assembly substrate material and the buttering layer(s), buffer layer, or ultra-low friction coating. Hardbanding may be utilized in the oil and gas drilling industry to prevent tool joint and casing wear.

An "interface" is a transition region from one layer to an adjacent layer wherein one or more constituent material composition and/or property value changes from 5% to 95% of the values that characterize each of the adjacent layers.

A "graded interface" is an interface that is designed to have a gradual change of constituent material composition and/or property value from one layer to the adjacent layer. For example, a graded interface may be created as a result of gradually stopping the processing of a first layer while simultaneously gradually commencing the processing of a second layer.

A "non-graded interface" is an interface that has a sudden change of constituent material composition and/or property value from one layer to the adjacent layer. For example, a non-graded interface may be created as a result of stopping the processing of one layer and subsequently commencing the processing of a second layer.

DETAILED DESCRIPTION

All numerical values within the detailed description and the claims herein are modified by "about" or "approximately"

the indicated value, and take into account experimental error and variations that would be expected by a person having ordinary skill in the art.

Overview of Use of Ultra-Low Friction Coatings and Associated Benefits:

Deep wells for the exploration and production of oil and gas are drilled with a rotary drilling system which creates a borehole by means of a rock cutting tool, drill bit. The torque driving the bit is often generated at the surface by a motor with mechanical transmission box. Via the transmission, the motor drives the rotary table or top drive unit. The medium to transport the energy from the surface to the drill bit is a drill string (abbreviated herein as DS), mainly consisting of drill pipes. The lowest part of the drill string is the bottom hole assembly (abbreviated herein as BHA) consisting of drill collars, stabilizers and others including measurement devices, under-reamers, and motors. The combination of the drill string and the bottom hole assembly is referred to herein as a drill stem assembly. Alternatively, coiled tubing may replace the drill string, and the combination of coiled tubing and the bottom hole assembly is also referred to herein as a drill stem assembly. The bottom hole assembly is connected to the drill bit at the drilling end.

For the case of a drill stem assembly including a drill string, periodically during drilling operations, new sections of drill pipe are added to the drill stem, and the upper sections of the borehole are normally cased to stabilize the wells, and drilling is resumed. Thus, the drill stem assembly (drill string/BHA) undergoes various types of friction and wear caused by interaction between the drill string/BHA/bit and the casing ("cased hole" part of the borehole) or the rock cuttings and mud in the annulus or drill string/BHA/bit with open borehole ("open hole" part of the borehole).

The trend in drilling is deeper and harder formations where the low rate of penetration (abbreviated herein as ROP) leads to high drilling costs. In other areas such as deep shale drilling, bottom hole balling may occur wherein shale cuttings stick to the bit cutting face by differential mud pressure across the cuttings-mud and cuttings-bit face, reducing drilling efficiencies and ROP significantly. Sticking of cuttings to the BHA components such as stabilizers can also lead to drilling inefficiencies.

Drill stem assembly friction and wear are important causes for premature failure of drill string or coiled tubing and the associated drilling inefficiencies. Stabilizer wear can affect the borehole quality in addition to leading to vibrational inefficiencies. These inefficiencies can manifest themselves as ROP limiters or "founder points" in the sense that the ROP does not increase linearly with weight on bit (abbreviated herein as WOB) and revolutions per minute (abbreviated herein as RPM) of the bit as predicted from bit mechanics. This limitation is depicted schematically in FIG. 1.

It has been recognized in the drilling industry that drill stem vibrations and bit balling are two of the most challenging rate of penetration limiters. The ultra-low friction coatings disclosed herein when applied to the drill stem assembly help to mitigate these ROP limitations.

The deep drilling environment, especially in hard rock formations, induces severe vibrations in the drill stem assembly, which can cause reduced drill bit rate of penetration and premature failure of the equipment downhole. The two main vibration excitation sources are interactions between drill bit and rock formation, and between the drill stem assembly and wellbore or casing. As a consequence, the drill stem assembly vibrates axially, torsionally, laterally or usually with a combination of these three basic modes, that is, coupled vibrations. Therefore, this leads to a complex problem. A particularly challenging form of drill stem assembly vibration is stick-slip vibration mode, which is a manifestation of torsional instability. The static contact friction of various drill stem assembly components with the casing/borehole, and also the dynamic response of this contact friction as function of rotary speed may be important for the onset of stick-slip vibrations. For example, it is suggested that the bit induced stick-slip torsional instability may be triggered by velocity weakening of contact friction at the bit-borehole surfaces wherein the dynamic contact friction is lower than static friction.

Figure 2:
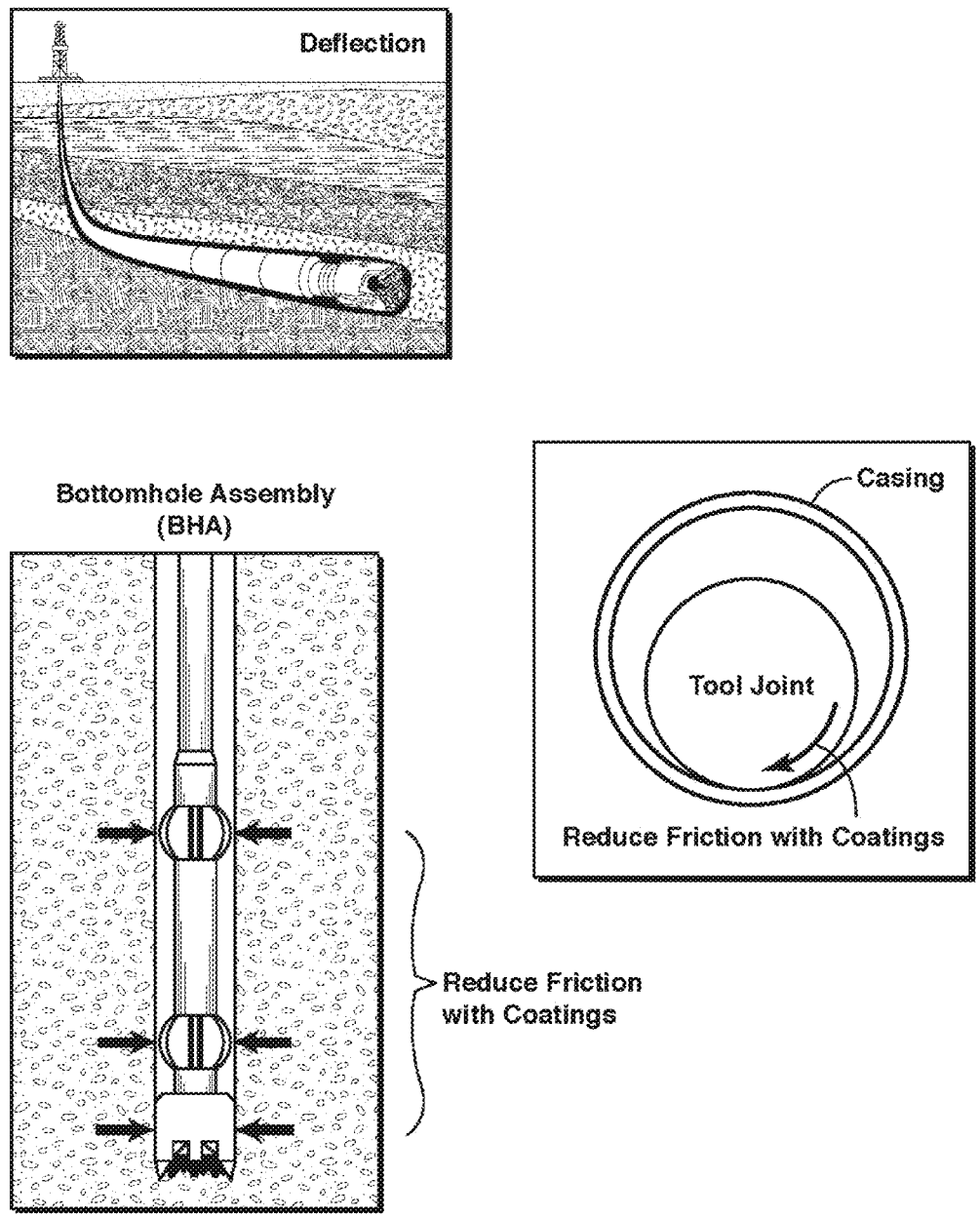
FIG. 2 depicts exemplary applications of the ultra-low friction coatings disclosed herein in subterranean drilling applications.

With today's advanced technology offshore drilling allows multi-lateral well drilling to be performed with the same starter well. This may mean drilling over far longer depths and the use of directional drilling technology, e.g., through the use of rotary steerable systems (abbreviated herein as RSS). Although this gives major cost and logistical advantages it also greatly increases wear on the drill string and casing. In some cases of directional or extended reach drilling, the degree of vertical deflection, angle from the vertical, can be as great as 90°, which are commonly referred to as horizontal wells. In drilling operations, the drill string assembly has a tendency to rest against the side wall of borehole or the well casing. This tendency is much greater in directional wells due to gravity effect. As the drill string increases in length and/or degree of deflection, the overall frictional drag created by rotating the drill string also increases. To overcome this increase in frictional drag, additional power is required to rotate the drill string. The resultant wear and the string/casing friction (cased hole) are critical to the drilling efficiency operation. The measured depth that can be achieved in these situations is often limited by the available torque capacity of the drilling rig. There is a need to find more efficient solutions to extend equipment lifetime and drilling capabilities with existing rigs and drive mechanisms to extend the lateral reach of the extended reach drilling. The high contact friction in these applications leads to high torque and drag which can limit the reach in extended reach drilling. It has been discovered that coating portions or all of the drill stem assembly with ultra-low friction coating may resolve these issues. FIG. 2 depicts areas of the drill stem assembly where the ultra-low friction coatings disclosed herein may be applied to reduce friction.

Another aspect of the instant disclosure relates to the use of ultra-low friction coatings to improve the performance of drilling tools, particularly a drilling head for drilling in formations containing clay and similar substances. The present disclosure utilizes the low surface energy novel materials or coating systems to provide thermodynamically low energy surfaces, e.g., non-water wetting surface for bottom hole components. The ultra-low friction coatings disclosed herein are suitable for oil and gas drilling in gumbo-prone areas, such as in deep shale drilling with high clay contents using water-based muds (abbreviated herein as WBM) to prevent drill bit and bottom hole assembly component balling.

Furthermore, the ultra-low friction coatings disclosed herein when applied to the drill string assembly can simultaneously reduce contact friction, bit balling and reduce wear while not compromising the durability and mechanical integrity of casing in the cased hole situation. Thus, the ultra-low friction coatings disclosed herein are "casing friendly" in that they do not degrade the life or functionality of the casing. The ultra-low friction coatings disclosed herein are also characterized by low or no sensitivity to velocity weakening friction behavior. Thus, the drill stem assemblies provided with the ultra-low friction coatings disclosed herein provide low friction surfaces with advantages in both mitigating stick-slip vibrations and reducing parasitic torque to further enable ultra-extended reach drilling.

The ultra-low friction coatings disclosed herein for drill stem assemblies thus provide for the following exemplary non-limiting advantages: i) mitigating stick-slip vibrations, ii) reducing torque and drag for extending the reach of extended reach wells, and iii) mitigating drill bit and other bottom hole component balling. These three advantages together with minimizing the parasitic torque may lead to significant improvements in drilling rate of penetration as well as durability of downhole drilling equipment, thereby also contributing to reduced non-productive time (abbreviated herein as NPT). The ultra-low friction coatings disclosed herein not only reduce friction, but also withstand the aggressive downhole drilling environments requiring chemical stability, corrosion resistance, impact resistance, durability against wear, erosion and mechanical integrity (coating-substrate interface strength). The ultra-low friction coatings disclosed herein are also amenable for application to complex shapes without damaging the substrate properties. Moreover, the ultra-low friction coatings disclosed herein also provide low energy surfaces necessary to provide resistance to balling of bottom hole components.

The body assembly or the coated drill stem assembly may include hardbanding on at least a portion of the exposed outer surface to provide enhanced wear resistance and durability. Drill stem assemblies experience significant wear at the hardbanded regions since these are primary contact points between drill stem and casing or open borehole. The wear can be exacerbated by abrasive sand and rock particles becoming entrained in the interface and abrading the surfaces. The coatings on the coated drill stem assembly disclosed herein show high hardness properties to help mitigate abrasive wear. Using hardbanding that has a surface with a patterned design may promote the flow of abrasive particles past the coated hardbanded region and reduce the amount of wear and damage to the coating and hardbanded portion of the component. Using coatings in conjunction with patterned hardbanding will further reduce wear due to abrasive particles.

Therefore, another aspect of the disclosure is the use of ultra-low friction coatings on a hardbanding on at least a portion of the exposed outer surface of the body assembly, where the hardbanding surface has a patterned design that reduces entrainment of abrasive particles that contribute to wear. During drilling, abrasive sand and other rock particles suspended in drilling fluid can travel into the interface between the body assembly or drill string assembly and casing or open borehole. These abrasive particles, once entrained into this interface, contribute to the accelerated wear of the body assembly, drill string assembly, and casing. There is a need to extend equipment lifetime to maximize drilling and economic efficiency. Since hardbanding that is made proud above the surface of the body assembly or drill string assembly makes the most contact with the casing or open borehole, it experiences the most abrasive wear due to the entrainment of sand and rock particles. It is therefore advantageous to use hardbanding and ultra-low friction coatings together to provide for wear protection and low friction. It is further advantageous to apply hardbanding in a patterned design wherein grooves between hardbanding material allow for the flow of particles past the hardbanded region without becoming entrained and abrading the interface. It is even further advantageous to reduce the contact area between hardbanding and casing or open borehole to mitigate sticking or balling by rock cuttings. The ultra-low friction coating could be applied in any arrangement, but preferably it would be applied to the entire area of the pattern since material passing through the passageways of the pattern would have reduced chance of sticking to the pipe.

An aspect of the present disclosure relates to an advantageous coated drill stem assembly for subterranean rotary drilling operations comprising: a body assembly with an exposed outer surface including a drill string coupled to a bottom hole assembly, a coiled tubing coupled to a bottom hole assembly, or a casing string coupled to a bottom hole assembly, hardbanding on at least a portion of the exposed outer surface of the body assembly, where the hardbanding surface may or may not have a patterned design, an ultra-low friction coating on at least a portion of the hardbanding, and one or more buttering layers interposed between the hardbanding and the ultra-low friction coating.

A further aspect of the present disclosure relates to an advantageous method for reducing friction in a coated drill stem assembly during subterranean rotary drilling operations comprising: providing a drill stem assembly comprising a body assembly with an exposed outer surface including a drill string coupled to a bottom hole assembly, a coiled tubing coupled to a bottom hole assembly, or a casing string coupled to a bottom hole assembly, hardbanding on at least a portion of the exposed outer surface of the body assembly, where the hardbanding surface may or may not have a patterned design, an ultra-low friction coating on at least a portion of the hardbanding, and one or more buttering layers interposed between the hardbanding and the ultra-low friction coating, and utilizing the coated drill stem assembly in subterranean rotary drilling operations.

A still further aspect of the present disclosure relates to the interposition of one or more buttering layer(s) between the outer surface of the body assembly or hardbanding, and the ultra-low friction coating. The buttering layer may be created or deposited as a result of one or more techniques including electrochemical or electroless plating methods, Plasma Vapor Deposition (PVD) or Plasma Assisted Chemical Vapor Deposition (PACVD) methods, carburizing, nitriding or boriding methods, or ultra-fine superpolishing methods. The buttering layer may be graded, and may serve several functional purposes, including but not limited to: decreased surface roughness, enhanced adhesion with other layer(s), enhanced mechanical integrity and performance.

A still further aspect of the present disclosure relates to the advantageous method of forming one or more buttering layer(s) interposed between the outer surface of the body assembly or hardbanding, and the ultra-low friction coating. The buttering layer may be created or deposited as a result of one or more techniques including electrochemical or electroless plating methods, Plasma Vapor Deposition (PVD) or Plasma Assisted Chemical Vapor Deposition (PACVD) methods, carburizing, nitriding or boriding methods, or ultra-fine superpolishing methods. The buttering layer may be graded, and may serve several functional purposes, including but not limited to: decreased surface roughness, enhanced adhesion with other layer(s), enhanced mechanical integrity and performance.

A still yet further aspect of the present disclosure relates to the grading of one or more buffer layer(s) or ultra-low friction layer(s) comprising the ultra-low friction coating. Grading may be achieved through several routes, including the gradual transition from processing of one layer to the next (e.g. transition in deposition from buffer layer constituent(s) to ultra-low friction layer constituent(s) using PVD and PACVD in a vacuum chamber), or post-processing techniques, such as heat treatment, to enable grading between adjacent layers.

Exemplary Embodiments of the Current Disclosure

In one exemplary embodiment, an ultra-low friction coating on a drill stem assembly includes a body assembly with an exposed outer surface including a drill string coupled to a bottom hole assembly, a coiled tubing coupled to a bottom hole assembly, or a casing string coupled to a bottom hole assembly and an ultra-low friction coating on at least a portion of the exposed outer surface of the body assembly, wherein the body assembly has at least a portion that has hardbanding on the exposed surface, one or more ultra-low friction coatings, and one or more buttering layers interposed between the hardbanding and ultra-low friction coating. In another exemplary embodiment, at least one of the buttering layers has a minimum hardness of 400 VHN.

The coating or ultra-low friction coating disclosed herein for coated drill stem assemblies may include one or more ultra-low friction layers chosen from an amorphous alloy, an electroless nickel-phosphorous composite, graphite, $MoS_2$, $WS_2$, a fullerene based composite, a boride based cermet, a quasicrystalline material, a diamond based material, diamond-like-carbon (DLC), boron nitride, carbon nanotubes, graphene sheets, metallic particles of high aspect ratio (i.e. relatively long and thin), ring-shaped materials (e.g. carbon nanorings), oblong particles and combinations thereof. The diamond-based material may be chemical vapor deposited (CVD) diamond or polycrystalline diamond compact (PDC). The composition of the ultra-low friction coating may be uniform or variable through its thickness. In one advantageous embodiment, the coated oil and gas well production device is coated with a diamond-like-carbon (DLC) coating, and more particularly the DLC coating may be chosen from tetrahedral amorphous carbon (ta-C), tetrahedral amorphous hydrogenated carbon (ta-C:H), diamond-like hydrogenated carbon (DLCH), polymer-like hydrogenated carbon (PLCH), graphite-like hydrogenated carbon (GLCH), silicon containing diamond-like-carbon (Si-DLC), titanium containing diamond-like-carbon (Ti-DLC), chromium containing diamond-like-carbon (Cr-DLC), metal containing diamond-like-carbon (Me-DLC), oxygen containing diamond-like-carbon (O-DLC), nitrogen containing diamond-like-carbon (N-DLC), boron containing diamond-like-carbon (B-DLC), fluorinated diamond-like-carbon (F-DLC), sulfur-containing diamond-like carbon (S-DLC), and combinations thereof. These one or more ultra-low friction layers may be graded for improved durability, friction reduction, adhesion, and mechanical performance.

The coefficient of friction of the coating, also referred to as an ultra-low friction coating, may be less than or equal to 0.15, or 0.13, or 0.11, or 0.09 or 0.07 or 0.05. The friction force may be calculated as follows: Friction Force=Normal Force×Coefficient of Friction. In another form, the coated drill stem assembly may have a dynamic friction coefficient of the coating that is not lower than 50%, or 60%, or 70%, or 80% or 90% of the static friction coefficient of the coating. In yet another form, the coated drill stem assembly may have a dynamic friction coefficient of the coating that is greater than or equal to the static friction coefficient of the coating.

Significantly decreasing the coefficient of friction (COF) of the coated drill stem assembly will result in a significant decrease in the friction force. This translates to a smaller force required to slide the cuttings along the surface. If the friction force is low enough, it may be possible to increase the mobility of cuttings along the surface until they can be lifted off the surface of the drill stem assembly or transported to the annulus. It is also possible that the increased mobility of the cuttings along the surface may inhibit the formation of differentially stuck cuttings due to the differential pressure between mud and mud-squeezed cuttings-cutter interface region holding the cutting onto the cutter face. Lowering the COF is accomplished by coating these surfaces with coatings disclosed herein. These coatings are able to withstand the aggressive environments of drilling including resistance to erosion, corrosion, impact loading, and exposure to high temperatures.

Figure 3:
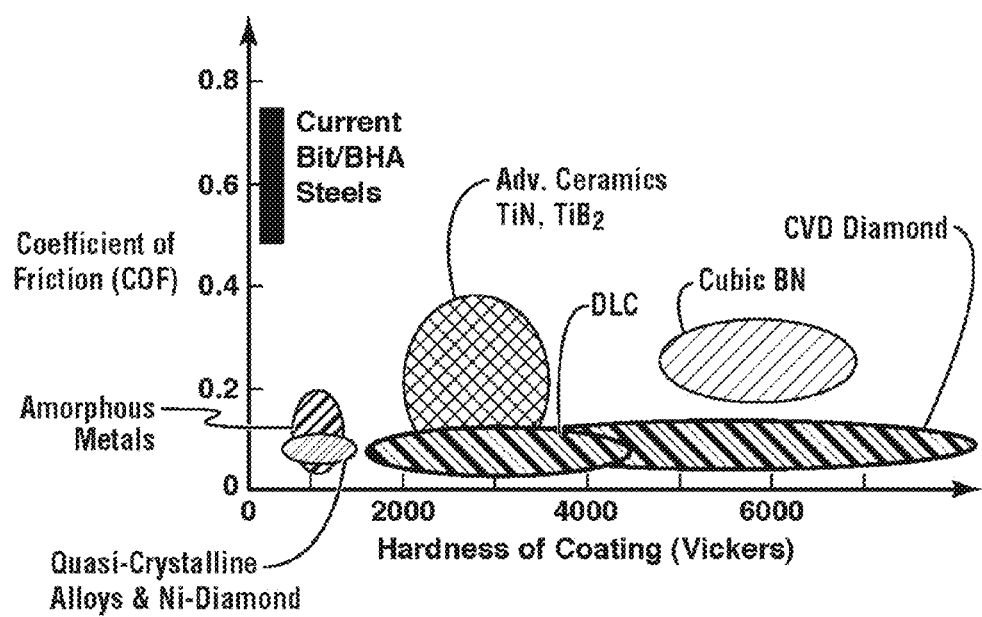
FIG. 3 depicts the relationship between coating COF and coating hardness for some of the ultra-low friction coatings disclosed herein versus steel base case.

In addition to low COF, the coatings of the present disclosure are also of sufficiently high hardness to provide durability against wear during drilling and completion operations. More particularly, the Vickers hardness or the equivalent Vickers hardness of the coatings disclosed herein may be greater than or equal to 400, 500, 600, 700, 800, 900, 1000, 1500, 2000, 2500, 3000, 3500, 4000, 4500, 5000, 5500, or 6000. A Vickers hardness of greater than 400 allows for the drill stem assembly to be used for drilling in shales with water based muds and the use of spiral stabilizers. Spiral stabilizers have less tendency to cause BHA vibrations than straight-bladed stabilizers. FIG. 3 depicts the relationship between coating COF and coating hardness for some of the coatings disclosed herein relative to the prior art drill string and BHA steels. The combination of low COF and high hardness for the coatings disclosed herein when used as a surface coating on the drill stem assemblies provides for hard, low COF durable materials for downhole drilling applications.

The coating or ultra-low friction coating disclosed herein may include one or more ultra-low friction layers, one or more buttering layers, one or more buffer layers, and any combinations thereof, forming a multilayer coating. This multilayer coating may be placed directly onto a base substrate material or, in another non-limiting embodiment, placed on a portion of a hardbanded material interposed between the coating and the base substrate material. (See FIG. 14.)

The coated drill stem assembly may be fabricated from iron based materials, carbon steels, steel alloys, stainless steels, Al-base alloys, Ni-base alloys and Ti-base alloys, ceramics, cermets, and polymers. 4142 type steel is one non-limiting exemplary material. The surface of the base substrate may be optionally subjected to an advanced surface treatment prior to coating application to form a buttering layer, upon which a coating may be applied forming a multilayer coating. Other exemplary non-limiting substrate materials may be used, such as tungsten-carbide cobalt. The buttering layer may provide one or more of the following benefits: extended durability, enhanced wear resistance, reduced friction coefficient, enhanced fatigue and extended corrosion performance of the overall coating. The one or more buttering layers is formed by one or more of the following non-limiting exemplary processes chosen from: PVD, PACVD, CVD, ion implantation, carburizing, nitriding, boronizing, sulfiding, siliciding, oxidizing, an electrochemical process, an electroless plating process, a thermal spray process, a kinetic spray process, a laser-based process, a friction-stir process, a shot peening process, a laser shock peening process, a welding process, a brazing process, an ultra-fine superpolishing process, a tribochemical polishing process, an electrochemical polishing process, and combinations thereof. Such surface treatments may harden the substrate surface and retard plastic deformation by introducing additional species and/or introduce deep compressive residual stress resulting in inhibition of the crack growth induced by fatigue, impact and wear damage. A Vickers hardness of greater than 400 is required, preferably Vickers hardness values in excess of 950 to exceed hardbanding, 1500 to exceed quartz particles, and 1700 to exceed the hardness of other layers are desired. The buttering layer may be a structural support member for overlying layers of the coating.

In another embodiment of the coated drill stem assembly disclosed herein, the body assembly may include hardbanding on at least a portion of the exposed outer surface to provide enhanced wear resistance and durability. The one or more coating layers are deposited on top of the hardbanding. The thickness of hardbanding layer may range from several orders of magnitude times that of or equal to the thickness of the outer coating layer. Non-limiting exemplary hardbanding thicknesses are 1 mm, 2 mm, and 3 mm proud above the surface of the drill stem assembly. Non-limiting exemplary hardbanding materials include cermet based materials, metal matrix composites, nanocrystalline metallic alloys, amorphous alloys and hard metallic alloys. Other non-limiting exemplary types of hardbanding include carbides, nitrides, borides, and oxides of elemental tungsten, titanium, niobium, molybdenum, iron, chromium, and silicon dispersed within a metallic alloy matrix. Such hardbanding may be deposited by weld overlay, thermal spraying or laser/electron beam cladding.

In yet another embodiment of the coated drill stem assembly disclosed herein, the multilayer ultra-low friction coating may further include one or more buttering layers interposed between the outer surface of the body assembly or hardbanding layer and the ultra-low friction layers on at least a portion of the exposed outer surface. Buttering layers may serve to provide enhanced toughness, to enhance load carrying capacity, to reduce surface roughness, to inhibit diffusion from the base substrate material or hardbanding into the outer coating, and/or to minimize residual stress absorption. Non-limiting examples of buttering layer materials are the following: a stainless steel, a chrome-based alloy, an iron-based alloy, a cobalt-based alloy, a titanium-based alloy, or a nickel-based alloy, alloys or carbides or nitrides or carbo-nitrides or borides or silicides or sulfides or oxides of the following elements: silicon, titanium, chromium, aluminum, copper, iron, nickel, cobalt, molybdenum, tungsten, tantalum, niobium, vanadium, zirconium, hafnium, or combinations thereof. The one or more buttering layers may be graded for improved durability, friction reduction, adhesion, and mechanical performance.

Ultra-low friction coatings may possess a high level of intrinsic residual stress (~1 GPa) which has an influence on their tribological performance and adhesion strength to the substrate (e.g., steel) for deposition. In order to benefit from the low friction and wear/abrasion resistance benefits of ultra-low friction coatings for drill stem assemblies disclosed herein, they also need to exhibit durability and adhesive strength to the outer surface of the body assembly for deposition.

Typically ultra-low friction coatings deposited directly on steel surface suffer from poor adhesion strength. This lack of adhesion strength restricts the thickness and the incompatibility between ultra-low friction coating and steel interface, which may result in delamination at low loads. To overcome these problems, in one embodiment, the ultra-low friction coatings disclosed herein may also include buffer layers of various metallic (for example, but not limited to, Cr, W, Ti, Ta), semimetallic (for example, but not limited to, Si) and ceramic compounds (for example, but not limited to, $Cr_xN$, TiN, ZrN, AlTiN, SiC, TaC) between the outer surface of the body assembly and the ultra-low friction layer. These ceramic, semimetallic and metallic buffer layers relax the compressive residual stress of the ultra-low friction coatings disclosed herein to increase the adhesion and load carrying capabilities. An additional approach to improve wear, friction, and mechanical durability of the ultra-low friction coatings disclosed herein is to incorporate multiple ultra-low friction layers with intermediate buffer layers to relieve residual stress build-up.

The coatings for use in coated drill stem assemblies disclosed herein may also include one or more buffer layers (also referred to herein as adhesive layers or interlayers). The one or more buffer layers may be interposed between the outer surface of the body assembly, hardbanding, or buttering layer, and the single layer or the two or more layers in a multi-layer coating configuration. The one or more buffer layers may be chosen from the following elements or alloys of the following elements: silicon, aluminum, copper, molybdenum, titanium, chromium, tungsten, tantalum, niobium, vanadium, zirconium, and/or hafnium. The one or more buffer layers may also be chosen from carbides, nitrides, carbo-nitrides, oxides of the following elements: silicon, aluminum, copper, molybdenum, titanium, chromium, tungsten, tantalum, niobium, vanadium, zirconium, and/or hafnium. The one or more buffer layers are generally interposed between the hardbanding (when utilized) and one or more coating layers or between ultra-low friction layers. The buffer layer thickness may be a fraction of, or approach, or exceed the thickness of an adjacent ultra-low friction layer. The one or more buffer layers may be graded for improved durability, friction reduction, adhesion, and mechanical performance. A buffer layer may be interposed between any other layers, including another buffer layer or one or more buttering layers.

In another embodiment of the coated drill stem assembly disclosed herein, the hardbanding surface has a patterned design to reduce entrainment of abrasive particles that contribute to wear. The ultra-low friction coating is deposited on top of the hardbanding pattern. The hardbanding pattern may include both recessed and raised regions and the thickness variation in the hardbanding can be as much as its total thickness.

In another embodiment, the buttering layer may be used in conjunction with hardbanding, where the hardbanding is on at least a portion of the exposed outer or inner surface to provide enhanced wear resistance and durability to the coated drill stem assembly, where the hardbanding surface may have a patterned design that reduces entrainment of abrasive particles that contribute to wear. In addition, one or more ultra-low friction coating layers may be deposited on top of the buttering layer to form a multilayer coating.

The coated drill stem assemblies with the coatings disclosed herein also provide a surface energy less than 1, 0.9, 0.8, 0.7, 0.6, 0.5, 0.4, 0.3, 0.2, or 0.1 $J/m^2$. In subterraneous rotary drilling operations, this helps to mitigate sticking or balling by rock cuttings. Contact angle may also be used to quantify the surface energy of the coatings on the coated drill stem assembly disclosed herein. The water contact angle of the coatings disclosed herein is greater than 50, 60, 70, 80, or 90 degrees. Ultra-low friction coatings used on a hardbanding on at least a portion of the exposed outer surface of the body assembly, where the hardbanding surface has a patterned design that reduces entrainment of abrasive particles that contribute to wear, will also mitigate sticking or balling by rock cuttings. In one embodiment, such patterns may reduce the contact area by 10%-90% between hardbanding and casing or open borehole and reduce accumulation of cuttings.

In a further advantageous embodiment, one or more interfaces between the layers in a multilayer ultra-low friction coating are graded interfaces. The interfaces between various layers in the coating may have a substantial impact on the performance and durability of the coating. In particular, non-graded interfaces may create sources of weakness including one or more of the following: stress concentrations, voids, residual stresses, spallation, delamination, fatigue cracking, poor adhesion, chemical incompatibility, mechanical incompatibility. Graded interfaces allow for a gradual change in the material and physical properties between layers, which reduces the concentration of sources of weakness. The thickness of each graded interface may range from 10 nm to 10 microns, or 20 nm to 500 nm, or 50 nm to 200 nm. Alternatively the thickness of the graded interface may range from 5% to 100% of the thickness of the thinnest adjacent layer.

In a further advantageous embodiment, graded interfaces may be combined with the one or more ultra-low friction, buttering, and buffer layers, which may be graded and may be of similar or different materials, to further enhance the durability and mechanical performance of the coating.

Further Details Regarding Individual Layers and Interfaces

Figure 4:
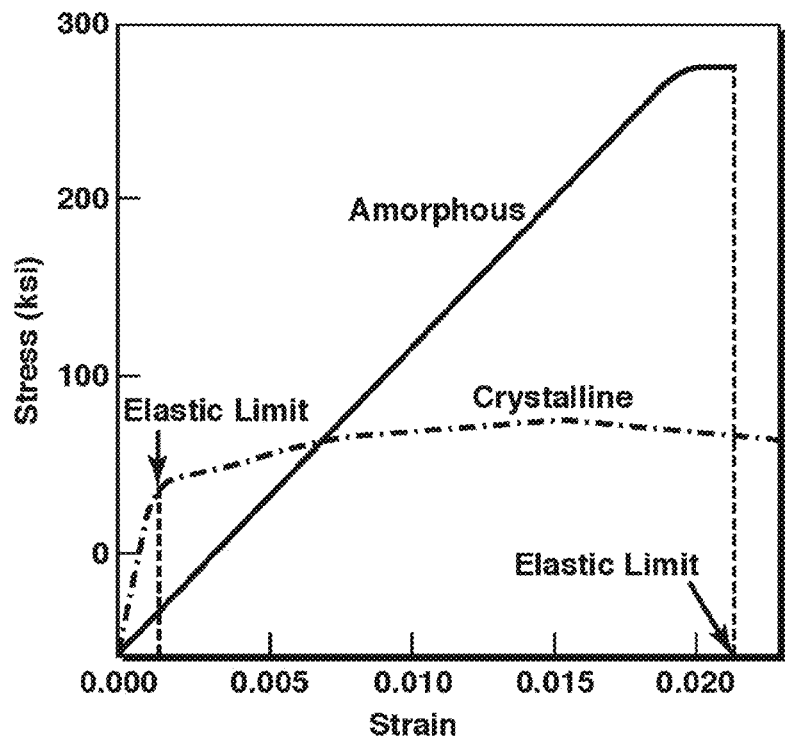
FIG. 4 depicts a representative stress-strain curve showing the high elastic limit of amorphous alloys compared to that of crystalline metals/alloys.

Further details regarding the ultra-low friction coatings disclosed herein for use in drill stem assemblies are as follows:

Ultra-Low Friction Amorphous Alloys:

Amorphous alloys as ultra-low friction coatings for drill stem assemblies disclosed herein provide high elastic limit/flow strength with relatively high hardness. These attributes allow these materials, when subjected to stress or strain, to stay elastic for higher strains/stresses as compared to the crystalline materials such as the steels used in drill stem assemblies. The stress-strain relationship between the amorphous alloys as ultra-low friction coatings for drill stem assemblies and conventional crystalline alloys/steels is depicted in FIG. 4, and shows that conventional crystalline alloys/steels can easily transition into plastic deformation at relatively low strains/stresses in comparison to amorphous alloys. Premature plastic deformation at the contacting surfaces leads to surface asperity generation and the consequent high asperity contact forces and COF in crystalline metals. The high elastic limit of amorphous metallic alloys or amorphous materials in general can reduce the formation of asperities resulting also in significant enhancement of wear resistance. Amorphous alloys as ultra-low friction coatings for drill stem assemblies would result in reduced asperity formation during drilling operation and thereby reduced COF of the drill stem assembly.

Amorphous alloys as ultra-low friction coatings for drill stem assemblies may be deposited using a number of coating techniques including, but to not limited to, thermal spraying, cold spraying, weld overlay, laser beam surface glazing, ion implantation and vapor deposition. Using a scanned laser or electron beam, a surface can be glazed and cooled rapidly to form an amorphous surface layer. In glazing, it may be advantageous to modify the surface composition to ensure good glass forming ability and to increase hardness and wear resistance. This may be done by alloying into the molten pool on the surface as the heat source is scanned. Hardfacing coatings may be applied also by thermal spraying including plasma spraying in air or in vacuum. Thinner, fully amorphous coatings as ultra-low friction coatings for drill stem assemblies may be obtained by thin film deposition techniques including, but not limited to, sputtering, chemical vapor deposition (CVD) and electrodeposition. Some amorphous alloy compositions disclosed herein, such as near equiatomic stoichiometry (e.g., Ni—Ti), may be amorphized by heavy plastic deformation such as shot peening or shock loading, including laser shock peening. The amorphous alloys as ultra-low friction coatings for drill stem assemblies disclosed herein yield an outstanding balance of wear and friction performance and require adequate glass forming ability for the production methodology to be utilized.

Ni—P Based Composite Coatings:

Electroless and electro plating of nickel-phosphorous (Ni—P) based composites as coatings for a drill stem assembly disclosed herein may be formed by codeposition of inert particles onto a metal matrix from an electrolytic or electroless bath. The Ni—P composite coating provides excellent adhesion to most metal and alloy substrates. The final properties of these coatings depend on the phosphorous content of the Ni—P matrix, which determines the structure of the coatings, and on the characteristics of the embedded particles such as type, shape and size. Ni—P coatings with low phosphorus content are crystalline Ni with supersaturated P. With increasing P content, the crystalline lattice of nickel becomes more and more strained and the crystallite size decreases. At a phosphorous content greater than 12 wt %, or 13 wt %, or 14 wt % or 15 wt %, the coatings exhibit a predominately amorphous structure. Annealing of amorphous Ni—P coatings may result in the transformation of amorphous structure into an advantageous crystalline state. This crystallization may increase hardness, but deteriorate corrosion resistance. The richer the alloy in phosphorus, the slower the process of crystallization. This expands the amorphous range of the coating. The Ni—P composite coatings can incorporate other metallic elements including, but not limited to, tungsten (W) and molybdenum (Mo) to further enhance the properties of the coatings. The nickel-phosphorous (Ni—P) based composite coating disclosed herein may include micron-sized and sub-micron sized particles. Non-limiting exemplary particles include: diamonds, nanotubes, rings (including carbon nanorings), carbides, nitrides, borides, oxides and combinations thereof. Other non-limiting exemplary particles include plastics (e.g., fluoro-polymers) and hard metals.

Ultra-Low Friction Layered Materials and Novel Composite Coating Layers:

Layered materials such as graphite, $MoS_2$ and $WS_2$ (platelets of the 2H polytype) may be used as ultra-low friction coatings for drill stem assemblies. In addition, fullerene based composite coating layers which include fullerene-like nanoparticles may also be used as ultra-low friction coatings for drill stem assemblies. Fullerene-like nanoparticles have advantageous tribological properties in comparison to typical metals while alleviating the shortcomings of conventional layered materials (e.g., graphite, $MoS_2$). Nearly spherical fullerenes may also behave as nanoscale ball bearings. The main favorable benefit of the hollow fullerene-like nanoparticles may be attributed to the following three effects, (a) rolling friction, (b) the fullerene nanoparticles function as spacers, which eliminate metal to metal contact between the asperities of the two mating metal surfaces, and (c) three body material transfer. Sliding/rolling of the fullerene-like nanoparticles in the interface between rubbing surfaces may be the main friction mechanism at low loads, when the shape of nanoparticle is preserved. The beneficial effect of fullerene-like nanoparticles increases with the load. Exfoliation of external sheets of fullerene-like nanoparticles was found to occur at high contact loads (~1 GPa). The transfer of delaminated fullerene-like nanoparticles appears to be the dominant friction mechanism at severe contact conditions. The mechanical and tribological properties of fullerene-like nanoparticles can be exploited by the incorporation of these particles in binder phases of coating layers. In addition, composite coatings incorporating fullerene-like nanoparticles in a metal binder phase (e.g., Ni—P electroless plating) can provide a film with self-lubricating and excellent anti-sticking characteristics suitable for ultra-low friction coatings for drill stem assemblies.

More generally, other reinforcing materials could be applied in the ultra-low friction layers. These materials include, but are not limited to, carbon nanotubes, graphene sheets, metallic particles of high aspect ratio (i.e. relatively long and thin), ring-shaped materials (including carbon nanorings), and oblong particles. Typically these particles would have dimensions on the order of a few nanometers to microns.

Advanced Boride Based Cermets and Metal Matrix Composites:

Advanced boride based cermets and metal matrix composites as ultra-low friction coatings for drill stem assemblies may be formed on bulk materials due to high temperature exposure either by heat treatment or incipient heating during wear service. For instance, boride based cermets (e.g., TiB2-metal), the surface layer is typically enriched with boron oxide (e.g, $B_2O_3$) which enhances lubrication performance leading to low friction coefficient.

Quasicrystalline Materials:

Quasicrystalline materials may be used as ultra-low friction coatings for drill stem assemblies. Quasicrystalline materials have periodic atomic structure but do not conform to the 3-D symmetry typical of ordinary crystalline materials. Due to their crystallographic structure, most commonly icosahedral or decagonal, quasicrystalline materials with tailored chemistry exhibit unique combination of properties including low energy surfaces, attractive as a coating material for drill stem assemblies. Quasicrystalline materials provide non-stick surface properties due to their low surface energy (~30 $mJ/m^2$) on stainless steel substrate in icosahedral Al—Cu—Fe chemistries. Quasicrystalline materials as coating layers for drill stem assemblies may provide a combination of low friction coefficient (~0.05 in scratch test with diamond indentor in dry air) with relatively high microhardness (400~600 HV) for wear resistance. Quasicrystalline materials as coating layers for drill stem assemblies may also provide a low corrosion surface and the coated layer has smooth and flat surface with low surface energy for improved drilling performance. Quasicrystalline materials may be deposited on a metal substrate by a wide range of coating technologies, including, but not limited to, thermal spraying, vapor deposition, laser cladding, weld overlaying, and electrodeposition.

Super-Hard Materials (Diamond, Diamond-Like-Carbon, Cubic Boron Nitride):

Super-hard materials such as diamond, diamond-like-carbon (DLC) and cubic boron nitride (CBN) may be used as coatings for drill stem assemblies. Diamond is the hardest material known to man and under certain conditions may yield ultra-low coefficient of friction when deposited by chemical vapor deposition (abbreviated herein as CVD) on the body assembly. In one form, the CVD deposited carbon may be deposited directly on the surface. In another form, one or more buffer layers and/or buttering layers may be applied to the body assembly prior to CVD deposition. For example, when used on drill stem assemblies, a surface coating of CVD diamond may provide not only reduced tendency for sticking of cuttings at the surface, but also function as an enabler for using spiral stabilizers in operations with gumbo prone drilling (such as for example in the Gulf of Mexico). Coating the flow surface of the spiral stabilizers with CVD diamond may enable the cuttings to flow past the stabilizer up hole into the drill string annulus without sticking to the stabilizer.

In one advantageous embodiment, diamond-like-carbon (DLC) may be used as coatings for drill stem assemblies. DLC refers to amorphous carbon material that display some of the unique properties similar to that of natural diamond. Suitable diamond-like-carbon (DLC) layers or coatings may be chosen from ta-C, ta-C:H, DLCH, PLCH, GLCH, Si-DLC, titanium containing diamond-like-carbon (Ti-DLC), chromium containing diamond-like-carbon (Cr-DLC), Me-DLC, F-DLC, S-DLC, other DLC layer types, and combinations thereof DLC coatings include significant amounts of $sp^3$ hybridized carbon atoms. These $sp^3$ bonds may occur not only with crystals—in other words, in solids with long-range order—but also in amorphous solids where the atoms are in a random arrangement. In this case there will be bonding only between a few individual atoms, that is short-range order, and not in a long-range order extending over a large number of atoms. The bond types have a considerable influence on the material properties of amorphous carbon films. If the $sp^2$ type is predominant the DLC film may be softer, whereas if the $sp^3$ type is predominant, the DLC film may be harder.

Figure 5:
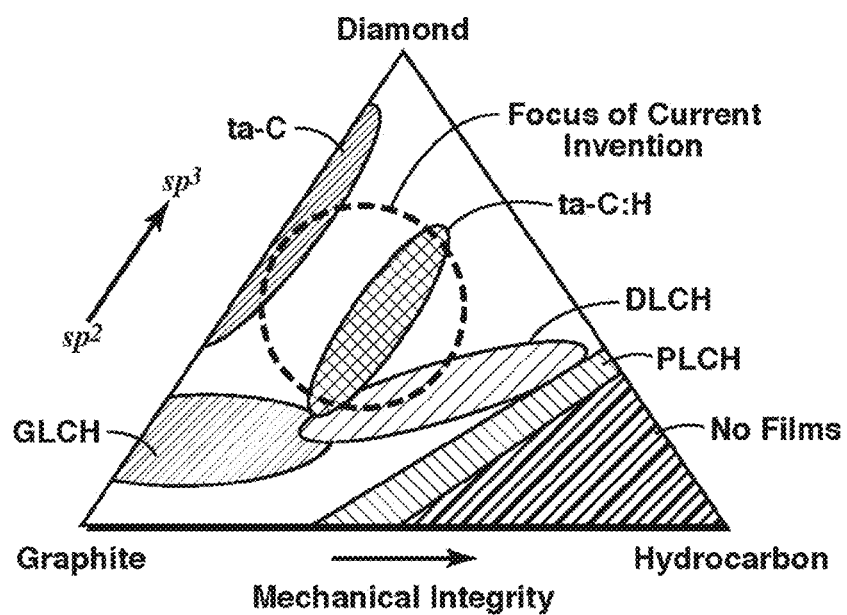
FIG. 5 depicts a ternary phase diagram of amorphous carbons.

DLC coatings may be fabricated as amorphous, flexible, and yet primarily $sp^3$ bonded "diamond". The hardest is such a mixture known as tetrahedral amorphous carbon, or ta-C (see FIG. 5). Such ta-C includes a high volume fraction (~80%) of $sp^3$ bonded carbon atoms. Optional fillers for the DLC coatings, include, but are not limited to, hydrogen, graphitic $sp^2$ carbon, and metals, and may be used in other forms to achieve a desired combination of properties depending on the particular application. The various forms of DLC coatings may be applied to a variety of substrates that are compatible with a vacuum environment and that are also electrically conductive. DLC coating quality is also dependent on the fractional content of alloying and/or doping elements such as hydrogen. Some DLC coating methods require hydrogen or methane as a precursor gas, and hence a considerable percentage of hydrogen may remain in the finished DLC material. In order to further improve their tribological and mechanical properties, DLC films are often modified by incorporating other alloying and/or doping elements. For instance, the addition of fluorine (F), and silicon (Si) to the DLC films lowers the surface energy and wettability. The reduction of surface energy in fluorinated DLC (F-DLC) is attributed to the presence of—CF2 and—CF3 groups in the film. However, higher F contents may lead to a lower hardness. The addition of Si may reduce surface energy by decreasing the dispersive component of surface energy. Si addition may also increase the hardness of the DLC films by promoting $sp^3$ hybridization in DLC films. Addition of metallic elements (e.g., W, Ta, Cr, Ti, Mo) to the film can reduce the compressive residual stresses resulting in better mechanical integrity of the film upon compressive loading.

The diamond-like phase or $sp^3$ bonded carbon of DLC is a thermodynamically metastable phase while graphite with $sp^2$ bonding is a thermodynamically stable phase. Thus the formation of DLC coating films requires non-equilibrium processing to obtain metastable $sp^3$ bonded carbon. Equilibrium processing methods such as evaporation of graphitic carbon, where the average energy of the evaporated species is low (close to kT where k is Boltzman's constant and T is temperature in absolute temperature scale), lead to the formation of 100% $sp^2$ bonded carbons. The methods disclosed herein for producing DLC coatings require that the carbon in the $sp^3$ bond length be significantly less than the length of the $sp^2$ bond. Hence, the application of pressure, impact, catalysis, or some combination of these at the atomic scale may force $sp^2$ bonded carbon atoms closer together into $sp^3$ bonding. This may be done vigorously enough such that the atoms cannot simply spring back apart into separations characteristic of $sp^2$ bonds. Typical techniques either combine such a compression with a push of the new cluster of $sp^3$ bonded carbon deeper into the coating so that there is no room for expansion back to separations needed for $sp^2$ bonding; or the new cluster is buried by the arrival of new carbon destined for the next cycle of impacts.

The DLC coatings disclosed herein may be deposited by physical vapor deposition, chemical vapor deposition, or plasma assisted chemical vapor deposition coating techniques. The physical vapor deposition coating methods include RF-DC plasma reactive magnetron sputtering, ion beam assisted deposition, cathodic arc deposition and pulsed laser deposition (PLD). The chemical vapor deposition coating methods include ion beam assisted CVD deposition, plasma enhanced deposition using a glow discharge from hydrocarbon gas, using a radio frequency (r.f.) glow discharge from a hydrocarbon gas, plasma immersed ion processing and microwave discharge. Plasma enhanced chemical vapor deposition (PECVD) is one advantageous method for depositing DLC coatings on large areas at high deposition rates. Plasma-based CVD coating process is a non-line-of-sight technique, i.e. the plasma conformally covers the part to be coated and the entire exposed surface of the part is coated with uniform thickness. The surface finish of the part may be retained after the DLC coating application. One advantage of PECVD is that the temperature of the substrate part does not increase above about 150° C. during the coating operation. The fluorine-containing DLC (F-DLC) and silicon-containing DLC (Si-DLC) films can be synthesized using plasma deposition technique using a process gas of acetylene ($C_2H_2$) mixed with fluorine-containing and silicon-containing precursor gases respectively (e.g., tetra-fluoro-ethane and hexa-methyl-disiloxane).

Figure 6:
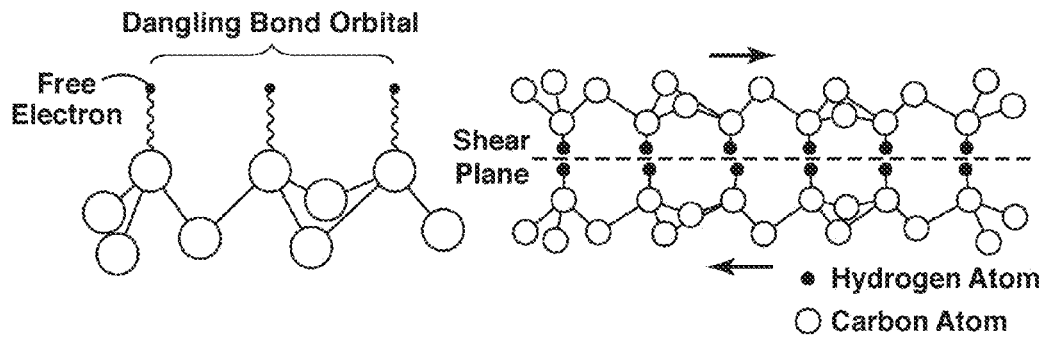
FIG. 6 depicts a schematic illustration of the hydrogen dangling bond theory.

The DLC coatings disclosed herein may exhibit coefficients of friction within the ranges earlier described. The ultra-low COF may be based on the formation of a thin graphite film in the actual contact areas. As $sp^3$ bonding is a thermodynamically unstable phase of carbon at elevated temperatures of 600 to 1500° C., depending on the environmental conditions, it may transform to graphite which may function as a solid lubricant. These high temperatures may occur as very short flash (referred to as the incipient temperature) temperatures in the asperity collisions or contacts. An alternative theory for the ultra-low COF of DLC coatings is the presence of hydrocarbon-based slippery film. The tetrahedral structure of a $sp^3$ bonded carbon may result in a situation at the surface where there may be one vacant electron coming out from the surface, that has no carbon atom to attach to (see FIG. 6), which is referred to as a "dangling bond" orbital. If one hydrogen atom with its own electron is put on such carbon atom, it may bond with the dangling bond orbital to form a two-electron covalent bond. When two such smooth surfaces with an outer layer of single hydrogen atoms slide over each other, shear will take place between the hydrogen atoms. There is no chemical bonding between the surfaces, only very weak van der Waals forces, and the surfaces exhibit the properties of a heavy hydrocarbon wax. As illustrated in FIG. 6, carbon atoms at the surface may make three strong bonds leaving one electron in the dangling bond orbital pointing out from the surface. Hydrogen atoms attach to such surface which becomes hydrophobic and exhibits low friction.

The DLC coatings for drill stem assemblies disclosed herein also prevent wear due to their tribological properties. In particular, the DLC coatings disclosed herein are resistant to abrasive and adhesive wear making them suitable for use in applications that experience extreme contact pressure, both in rolling and sliding contact.

Multi-Layered Ultra-Low Friction Coatings:

Multi-layered coatings for drill stem assemblies are disclosed herein and may be used in order to maximize the thickness of the coatings for enhancing their durability. The coatings disclosed herein may include not only a single layer, but also two or more coating layers, buffer layers, and/or buttering layers. For example, two, three, four, five, or more coating layers may be deposited on portions of the drill stem assembly. Each coating layer may range from 0.001 to 5000 microns in thickness with a lower limit of 0.001, 0.1, 0.5, 0.7, 1.0, 3.0, 5.0, 7.0, 10.0, 15.0, or 20.0 microns and an upper limit of 25, 50, 75, 100, 200, 500, 1000, 3000, or 5000 microns. The total thickness of the multi-layered coating may range from 0.5 to 5000 microns. The lower limit of the total multi-layered coating thickness may be 0.5, 0.7, 1.0, 3.0, 5.0, 7.0, 10.0, 15.0, or 20.0 microns in thickness. The upper limit of the total multi-layered coating thickness, not including the hardbanding, may be 25, 50, 75, 100, 200, 500, 1000, 3000, 5000 microns in thickness.

Buffer Layers:

The durability of ultra-low friction coatings may be improved for use in severe environments as experienced in ultra-ERD applications by incorporating buffer layers.

For example, DLC coatings have high compressive residual stress which could lead to cracking and delamination. Lab-scale wear/durability tests performed using a CETR (Center for Tribology) block-on-ring (BOR) setup, as well as large-scale tests performed at MOHR Engineering, have indicated that one failure mechanism of DLC coatings is cracking and delamination of the coating. In one possible, but not limiting, targeted range (1500≤Hv≤2500) of hardness for the DLC coatings, there is a need to reduce compressive stress in the DLC layer. One such technique being utilized currently is the deposition of one or more metallic/non-metallic buffer layers to alleviate residual stress before more DLC layers can be deposited on top of the buffer layer(s), thus creating a multilayer structure. The buffer layer(s) may also enable energy absorption, by accommodating deformation through dislocation activity (e.g. as in crystalline Ti buffer layers) or through shear banding (e.g. as in amorphous Si-based buffer layers).

The one or more buffer layers may be chosen from the following elements or alloys of the following elements: silicon, titanium, chromium, aluminum, copper, molybdenum, tungsten, tantalum, niobium, vanadium, zirconium, and/or hafnium. The one or more buffer layers may also be chosen from carbides, nitrides, carbo-nitrides, borides, oxides, sulfides, and silicides of the following elements: silicon, titanium, chromium, aluminum, copper, molybdenum, tungsten, tantalum, niobium, vanadium, zirconium, and/or hafnium. The one or more buffer layers are generally interposed between the drill stem assembly or hardbanding or buttering layer and one or more ultra-low friction layers, or between ultra-low friction layers. An individual buffer layer may be adjacent to a body assembly, hardbanding, buttering layer, another buffer layer, or ultra-low friction layer. The buffer layer thickness may be a fraction of, or approach, or exceed, the thickness of the adjacent layers.

In one embodiment, the buffer layers disclosed above may be deposited with the DLC layer(s) through a process such as PACVD, where a source and/or target is used to deposit the DLC layer and the buffer layer (e.g. Ti, Si, etc.). In one process form, this is performed using an alternating route, viz. a buffer layer is grown to a target thickness on the substrate. Then the buffer layer growth is shut off and the DLC layer is subsequently deposited to target thickness. This process is then repeated until the required multilayer architecture/thickness is achieved. A limitation with this technique are the non-graded interfaces created between the DLC layers and buffer layers, because non-graded interfaces may be sources of cracking and delamination. Moreover, due to the relatively low temperature nature of the deposition process, not much interdiffusion occurs at the interface between the buffer layer and the DLC layer, thus preserving the compositionally discrete multilayer structure.

In another embodiment, a multilayer coating of alternating DLC and buffer layers can be deposited with graded interfaces. Using a graded interface, adhesion between the DLC and the buffer layer may be enhanced through: (a) promotion of X—C bonding, where X denotes a non-carbon element or non-carbon elements in the buffer layer, (b) gradual alleviation of residual stresses from the DLC layer to the buffer layer, and (c) gradual change in the bonding of C from the DLC layer towards the buffer layer. An improved interface structure via the graded buffer layer interface can enable suppression of fracture/delamination along the graded interface between the buffer and DLC layers, thus enabling greater overall impact performance, load-bearing capacity of the DLC coating, and thus greater lifetime in service and realization of low-friction performance for longer duration.

Buttering Layers:

In yet another embodiment of the coated drill stem assembly for subterranean rotary drilling operations disclosed herein, the multilayer ultra-low friction coating may further include one or more buttering layers interposed between the outer surface of the body assembly or hardbanding layer and the ultra-low friction and/or buffer layers on at least a portion of the exposed outer surface.

In one embodiment of the nickel based alloy used as a buttering layer, the layer may be formed by electroplating. Electro-plated nickel may be deposited as a buttering layer with tailored hardness ranging from 150-1100, or 200 to 1000, or 250 to 900, or 300 to 700 Hv. Nickel is a silver-white metal, and therefore the appearance of the nickel based alloy buttering layer may range from a dull gray to an almost white, bright finish. In one form of the nickel alloy buttering layers disclosed herein, sulfamate nickel may be deposited from a nickel sulfamate bath using electoplating. In another form of the nickel alloy buttering layers disclosed herein, watts nickel may be deposited from a nickel sulfate bath. Watts nickel normally yields a brighter finish than does sulfamate nickel since even the dull watts bath contains a grain refiner to improve the deposit. Watts nickel may also be deposited as a semi-bright finish. Semi-bright watts nickel achieves a brighter deposit because the bath contains organic and/or metallic brighteners. The brighteners in a watts bath level the deposit, yielding a smoother surface than the underlying part. The semi-bright watts deposit can be easily polished to an ultrasmooth surface with high luster. A bright nickel bath contains a higher concentration of organic brighteners that have a leveling effect on the deposit. Sulfur-based brighteners are normally used to achieve leveling in the early deposits, and a sulfur-free organic, such as formaldehyde, is used to achieve a fully bright deposit as the plating layer thickens. In another form, the nickel alloy used for the buttering layer may be formed from black nickel, which is often applied over an under plating of electrolytic or electroless nickel. Among the advantageous properties afforded by a nickel based buttering layer, include, but are not limited to, corrosion prevention, magnetic properties, smooth surface finish, appearance, lubricity, hardness, reflectivity, and emissivity.

In another embodiment, the nickel based alloy used as a buttering layer may be formed as an electroless nickel plating. In this form, the electroless nickel plating is an autocatalytic process and does not use externally applied electrical current to produce the deposit. The electroless process deposits a uniform coating of metal, regardless of the shape of the part or its surface irregularities; therefore, it overcomes one of the major drawbacks of electroplating, the variation in plating thickness that results from the variation in current density caused by the geometry of the plated part and its relationship to the plating anode. An electroless plating solution produces a deposit wherever it contacts a properly prepared surface, without the need for conforming anodes and complicated fixtures. Since the chemical bath maintains a uniform deposition rate, the plater can precisely control deposit thickness simply by controlling immersion time. Low-phosphorus electroless nickel used as a buttering layer may yield the brightest and hardest deposits. Hardness ranges from 60-70 $R_C$ (or 697 Hv~1076 Hv). In another form, medium-phosphorus or mid-phos may be used as a buttering layer, which has a hardness of approximately 40-42 $R_C$ (or 392 Hv~412 Hv). Hardness may be improved by heat-treating into the 60-62 $R_C$ (or 697 Hv~746 Hv) range. Porosity is lower, and conversely corrosion resistance is higher than low-phosphorous electroless nickel. High-phosphorous electroless nickel is dense and dull in comparison to the mid and low-phosphorus deposits. High-phosphorus exhibits the best corrosion resistance of the electroless nickel family; however, the deposit is not as hard as the lower phosphorus content form. High-phosphorus electroless nickel is a virtually non-magnetic coating. For the nickel alloy buttering layers disclosed herein, nickel boron may be used as an underplate for metals that require firing for adhesion. The NiP amorphous matrix may also include a dispersed second phase. Non-limiting exemplary dispersed second phases include: i) electroless NiP matrix incorporated fine nano size second phase particles of diamond, ii) electroless NiP matrix with hexagonal boron nitride particles dispersed within the matrix, and iii) electroless NiP matrix with submicron PTFE particles (e.g. 20-25% by volume Teflon) uniformly dispersed throughout coating.

In yet another embodiment, the buttering layer may be formed of an electroplated chrome layer to produce a smooth and reflective surface finish. Hard chromium or functional chromium plating buttering layers provide high hardness that is in the range of 700 to 1,000, or 750 to 950, or 800 to 900 $H_v$, have a bright and smooth surface finish, and are resistant to corrosion with thicknesses ranging from 20 μm to 250, or 50 to 200, or 100 to 150 μm. Chromium plating buttering layers may be easily applied at low cost. In another form of this embodiment, a decorative chromium plating may be used as a buttering layer to provide a durable coating with smooth surface finish. The decorative chrome buttering layer may be deposited in a thickness range of 0.1 μm to 0.5 μm, or 0.15 μm to 0.45 μm, or 0.2 μm to 0.4 μm, or 0.25 μm to 0.35 μm. The decorative chrome buttering layer may also be applied over a bright nickel plating.

In still yet another embodiment, the buttering layer may be formed on the body assembly or hardbanding from a superpolishing process, which removes machining/grinding grooves and provides for a surface finish below 0.25 μm average surface roughness (Ra).

In still yet another embodiment, the buttering layer may be formed on the body assembly or hardbanding by one or more of the following non-limiting exemplary processes: PVD, PACVD, CVD, ion implantation, carburizing, nitriding, boronizing, sulfiding, siliciding, oxidizing, an electrochemical process, an electroless plating process, a thermal spray process, a kinetic spray process, a laser-based process, a friction-stir process, a shot peening process, a laser shock peening process, a welding process, a brazing process, an ultra-fine superpolishing process, a tribochemical polishing process, an electrochemical polishing process, and combinations thereof.

Interfaces:

The interfaces between various layers in the coating may have a substantial impact on the performance and durability of the coating. In particular, non-graded interfaces may create sources of weaknesses including one or more of the following: stress concentrations, voids, residual stresses, spallation, delamination, fatigue cracking, poor adhesion, chemical incompatibility, mechanical incompatibility. One non-limiting exemplary way to improve the performance of the coating is to use graded interfaces.

Graded interfaces allow for a gradual change in the material and physical properties between layers, which reduces the concentration of sources of weakness. One non-limiting exemplary way to create a graded interface during a manufacturing process is to gradually stop the processing of a first layer while simultaneously gradually commencing the processing of a second layer. The thickness of the graded interface can be optimized by varying the rate of change of processing conditions. The thickness of the graded interface may range from 10 nm to 10 microns or 20 nm to 500 nm or 50 nm to 200 nm. Alternatively the thickness of the graded interface may range from 5% to 95% of the thickness of the thinnest adjacent layer.

Patterned Hardbanding:

Tests conducted with pin-on-disk configuration showed greater coating durability than block-on-ring tests. Considering the different geometry of these tests, it was realized that the pin-on-disk configuration allowed sand grains in the lubricating fluid to go around the contact patch between the two bodies, whereas the block-on-ring configuration entrained the sand grains and did not allow the sand grains to take an alternate path around the contact area. The line contact patch, as opposed to the point contact, forced sand particles through the contact area which caused a higher rate of damage to the coating. The patterned hardbanding design will enable the sand grains to preferentially take an alternate path through the non-contact areas due to hydrodynamic forces and avoid a direct path through the maximum pressure of contact.

Non-limiting exemplary hardbanding pattern designs include lateral grooves or slots, longitudinal grooves or slots, angled grooves or slots, spiral grooves or slots, chevron shaped grooves or slots, recessed dimples, proud dimples, and any combination thereof. Such patterned hardbanding can be applied directly in the pattern shapes or machined in the hardbanding after bulk application. In one non-limiting embodiment, the patterns may reduce the contact area between hardbanding and casing or open borehole by 10%-90%.

The patterns selected may take application technology into consideration. Non-limiting exemplary application methods include weld overlay, thermal spraying or laser/electron beam cladding, and laser welding technology to facilitate patterning of hardbanding. The patterned, or alternatively non-patterned, hardbanding material may be manufactured by one or more processes including, but not limited to: a thermal spray process, a kinetic spray process, a laser-based process, a friction-stir process, a shot peening process, a laser shock peening process, a welding process, a brazing process, an ultra-fine superpolishing process, a tribochemical polishing process, an electrochemical polishing process, and combinations thereof.

Figure 22:
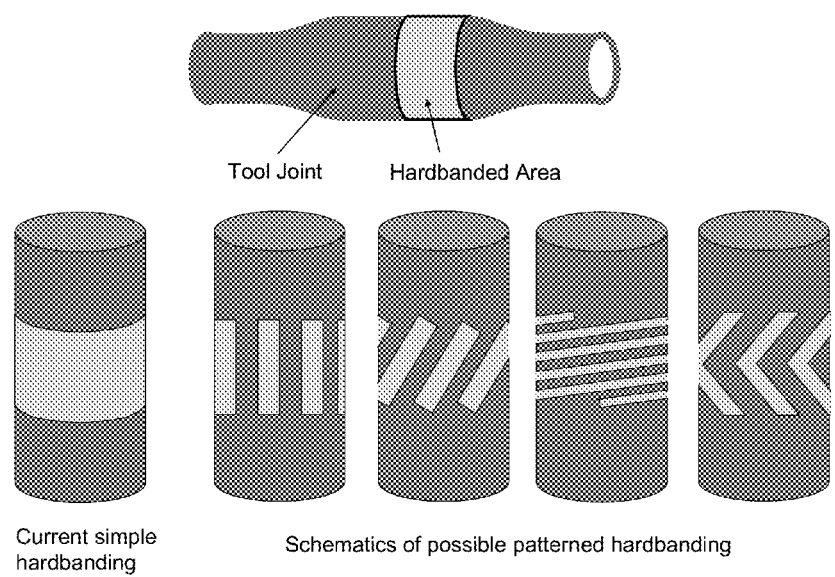
FIG. 22 illustrates some possible patterns for hardband application on a component of a drill stem assembly.

The patterns selected may take drilling conditions into consideration. The angle of the groove or slot pattern may be optimized considering the rotation speed of the drill stem and that the rotation speed is greater than the axial speed, wherein the drillstring normally "turns to the right" (clockwise) when viewed from the surface. A non-limiting exemplary design considering this is a single bead spiral made by laser welding techniques, wherein the angle is small in reference to the horizontal axis of the hardbanding section, and the grooves or regions between hardbanding material are 1 mm-5 mm deep and 1 mm-5 mm wide. Additional non-limiting exemplary design features include grooves or slots angled perpendicular or close to perpendicular to the horizontal axis of the hardbanded region to promote hydrodynamic lubrication in a horizontal wellbore, while also promoting the passage of abrasive particles. Yet another non-limiting exemplary design considering this is proud dimples 1 mm-10 mm in diameter to promote the passage of abrasive particles. FIG. 22 shows non-limiting exemplary schematic drawings of hardbanding with patterned surfaces (images not drawn to scale).

Other Advantageous Embodiments

In another form of the graded buffer layer interface embodiment, the $sp^2/sp^3$ ratio of the DLC layer may be controlled as a function of layer thickness. This is referred to as the DLC $sp^2/sp^3$ ratio embodiment. By controlling the $sp^2/sp^3$ ratio during the deposition process, the residual stress build-up at the buffer layer interface may be controlled. In one form of this embodiment, the initial deposition of DLC near the interface of the buffer layer may be more $sp^2$-rich by controlling deposition parameters, and then gradually transitioning to more $sp^3$-like character in the interior of the DLC layer. DLC deposition parameters that may be varied to adjust the $sp^2/sp^3$ ratio of the DLC coating layer include, but are not limited to, substrate bias, pulsing, and changing gas ratios. The gradient stress distribution generated as a result may decrease the tendency for delamination along DLC-buffer layer interface. Through tailoring of the structure at the DLC and buffer layer interface, and by effective control of the overall properties of the DLC structure (e.g. maintaining hardness values in the range specified above), an improvement in durability of the DLC coatings disclosed may be obtained.

In one advantageous embodiment of the coated drill stem assembly disclosed herein, multilayered carbon based amorphous coating layers, such as diamond-like-carbon (DLC) coatings, may be applied to the outer exposed surface. Suitable diamond-like-carbon (DLC) coatings may be chosen from ta-C, ta-C:H, DLCH, PLCH, GLCH, Si-DLC, Ti-DLC, Cr-DLC, Me-DLC, N-DLC, O-DLC, B-DLC, F-DLC, S-DLC, and combinations thereof. One particularly advantageous DLC coating for such applications is DLCH or ta-C:H. The structure of multi-layered DLC coatings may include individual DLC layers with adhesion or buffer layers between the individual DLC layers. Exemplary adhesion or buffer layers for use with DLC coatings include, but are not limited to, the following elements or alloys of the following elements: silicon, aluminum, copper, molybdenum, titanium, chromium, tungsten, tantalum, niobium, vanadium, zirconium, and/or hafnium. Other exemplary adhesion or buffer layers for use with DLC coatings include, but are not limited to, carbides, nitrides, carbo-nitrides, oxides of the following elements: silicon, aluminum, copper, molybdenum, titanium, chromium, tungsten, tantalum, niobium, vanadium, zirconium, and/or hafnium. These buffer or adhesive layers act as toughening and residual stress relieving layers and permit the total DLC coating thickness for multi-layered embodiments to be increased while maintaining coating integrity for durability.

In yet another advantageous form of the coated drill stem assembly disclosed herein, to improve the durability, mechanical integrity and downhole performance of relatively thin DLC coating layers, a hybrid coating approach may be utilized wherein one or more DLC coating layers may be deposited on a state-of-the-art hardbanding. This embodiment provides enhanced DLC/hardbanding interface strength and also provides protection to the downhole devices against premature wear should the DLC either wear away or delaminate. In another form of this embodiment, one or more buttering layers such as formed by an advanced surface treatment may be applied to the body assembly or hardbanding prior to the application of DLC layer(s) to extend the durability and enhance the wear, friction, fatigue and corrosion performance of DLC coatings. Advanced surface treatments may be chosen from ion implantation, nitriding, carburizing, shot peening, laser and electron beam glazing, laser shock peening, and combinations thereof. Such surface treatment can harden the substrate surface by introducing additional species and/or introduce deep compressive residual stress resulting in inhibition of the crack growth induced by impact and wear damage. In yet another form of this embodiment, one or more buttering layers as previously described may be interposed between the surface treated layer and one or more buffer or ultra-low friction coating layers. Furthermore, the advanced surface treatment methods identified above may be applied to the one or more buttering layers.

Figure 14:
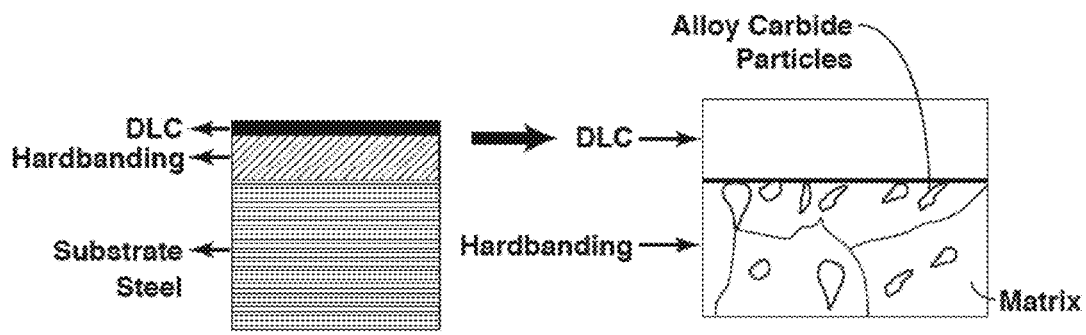
FIG. 14 depicts an exemplary schematic of hybrid DLC coating on hardbanding for drill stem assemblies illustrating several possible non-limiting configurations of base substrate material, hardbanding, one or more buttering layers, and one or more interposed buffer layers and ultra-low friction layers.
Figure 14:
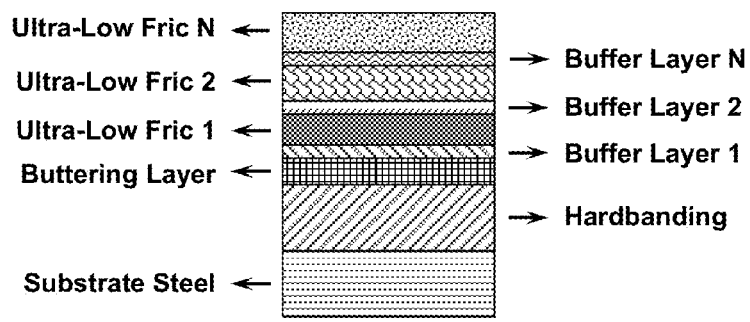

FIG. 14 is an exemplary embodiment of a coating on a drill stem assembly utilizing multi-layer hybrid coating layers, wherein a DLC coating layer is deposited on top of hardbanding on a steel substrate. In another form of this embodiment, the hardbanding may be post-treated (e.g., etched) to expose the alloy carbide particles to enhance the adhesion of ultra-low friction coatings to the hardbanding as also shown in FIG. 14. Such hybrid coatings consisting of multi-layer coatings and hardbanding can be applied to downhole devices such as the tool joints and stabilizers to enhance the durability and mechanical integrity of the DLC coatings deposited on these devices and to provide a "second line of defense" should the outer layer either wear-out or delaminate, against the aggressive wear and erosive conditions of the downhole environment in subterraneous rotary drilling operations. In another form of this embodiment, one or more buffer layers and/or one or more buttering layers as previously described may be included within the hybrid multi-layer coating structure to further enhance properties and performance of drill stem assemblies.

Exemplary Method of Using Coated Drill Stem Assembly Embodiments:

In one exemplary embodiment, an advantageous method of using a coated drill stem assembly includes providing a body assembly with an exposed outer surface including a drill string coupled to a bottom hole assembly, a coiled tubing coupled to a bottom hole assembly, or a casing string coupled to a bottom hole assembly and an ultra-low friction coating on at least a portion of the exposed outer surface of the body assembly, wherein the body assembly has at least a portion that has hardbanding on the exposed surface, one or more ultra-low friction coatings, and one or more buttering layers interposed between the hardbanding and ultra-low friction coating, and utilizing the coated drill stem assembly in a well construction or completion operation. In another exemplary embodiment, at least one of the buttering layers has a minimum hardness of 400 VHN.

In yet another exemplary embodiment, an advantageous method of using a coated drill stem assembly comprises providing a body assembly with an exposed outer surface including a drill string coupled to a bottom hole assembly, a coiled tubing coupled to a bottom hole assembly, or a casing string coupled to a bottom hole assembly and an ultra-low friction coating on at least a portion of the exposed outer surface of the body assembly, wherein the body assembly has at least a portion that has hardbanding on the exposed surface, one or more ultra-low friction coatings, and one or more buttering layers interposed between the hardbanding and ultra-low friction coating, wherein the coating is chosen from an amorphous alloy, a heat-treated electroless or electro plated based nickel-phosphorous composite with a phosphorous content greater than 12 wt %, graphite, $MoS_2$, $WS_2$, a fullerene based composite, a boride based cermet, a quasicrystalline material, a diamond based material, diamond-like-carbon (DLC), boron nitride, carbon nanotubes, graphene sheets, metallic particles of high aspect ratio (i.e. relatively long and thin), ring-shaped materials (e.g. carbon nanorings), oblong particles, and combinations thereof, and utilizing the coated drill stem assembly in a well construction or completion operation.

Drilling Conditions, Applications and Benefits:

The coated drill stem assembly for subterraneous rotary drilling operations disclosed herein includes a body assembly with an exposed outer surface that includes a drill string coupled to a bottom hole assembly, a coiled tubing coupled to a bottom hole assembly, or alternatively a string of casing and bottom hole assembly. The drill string includes one or more components chosen from drill pipe, tool joints, casing, liners, transition pipe between the drill string and bottom hole assembly including tool joints, heavy weight drill pipe including tool joints and wear pads, and combinations thereof. The bottom hole assembly includes one or more components chosen from, but not limited to: stabilizers, variable-gauge stabilizers, back reamers, drill collars, flex drill collars, rotary steerable tools, roller reamers, shock subs, mud motors, logging while drilling (LWD) tools, measuring while drilling (MWD) tools, coring tools, under-reamers, hole openers, centralizers, turbines, bent housings, bent motors, drilling jars, acceleration jars, crossover subs, bumper jars, torque reduction tools, float subs, fishing tools, fishing jars, washover pipe, logging tools, survey tool subs, non-magnetic counterparts of these components, associated external connections of these components, and combinations thereof.

The ultra-low friction coating may be deposited on at least a portion of or on all of the drill string, or casing string, and/or bottom hole assembly, and/or coiled tubing of a drill stem assembly. Hence, it is understood that the ultra-low friction coatings and hybrid forms of the ultra-low friction coating may be deposited on many combinations of the drill string components and/or bottom hole assembly components described above. When coated on the drill string, the ultra-low friction coatings disclosed herein may prevent or delay the onset of drill string buckling including helical buckling for preventing drill stem assembly failures and the associated non-productive time during drilling operations. Moreover, the ultra-low friction coatings disclosed herein may also provide resistance to torsional vibration instability including stick-slip vibration dysfunction of the drill string and bottom hole assembly.

The coated drill stem assemblies disclosed herein may be used during subterraneous rotary drilling operations with downhole temperature ranging from 20 to 400° F. with a lower limit of 20, 40, 60, 80, or 100° F., and an upper limit of 150, 200, 250, 300, 350 or 400° F. The coated drill stem assemblies disclosed herein may be used during subterraneous rotary drilling operations at drilling rotary speeds at the surface ranging from 0 to 200 RPM with a lower limit of 0, 10, 20, 30, 40, or 50 RPM and an upper limit of 100, 120, 140, 160, 180, or 200 RPM. In addition, the coated drill stem assemblies disclosed herein may be used during subterraneous rotary drilling operations with drilling mud pressure during the subterraneous rotary drilling operations ranging from 14 psi to 20,000 psi with a lower limit of 14, 100, 200, 300, 400, 500, or 1000 psi, and an upper limit of 5000, 10000, 15000, or 20000 psi.

The ultra-low friction coatings on drill string assemblies disclosed herein may reduce the required torque for drilling operation, and hence may allow the drilling operator to drill the oil/gas wells at higher rate of penetration (ROP) than when using conventional drilling equipment. In addition, ultra-low friction coatings on drill string assemblies disclosed herein provide wear resistance and low surface energy for the drill stem assembly that is advantageous to that of conventional hardbanded drill stem assemblies while reducing the wear on the well casing.

In one form, the coated drill stem assembly disclosed herein with the ultra-low friction coating on at least a portion of the exposed outer surface of the body assembly provides at least 2 times, or 3 times, or 4 times, or 5 times greater wear resistance than an uncoated drill stem assembly. Additionally, the coated drill stem assembly disclosed herein with the ultra-low friction coating on at least a portion of the exposed outer surface of the body assembly provides reduction in casing wear as compared to when an uncoated drill stem assembly is used for rotary drilling. Moreover, the coated drill stem assembly disclosed herein with the ultra-low friction coating on at least a portion of the exposed outer surface of the body assembly reduces casing wear by at least 2 times, or 3 times, or 4 times, or 5 times versus the use of an uncoated drill stem assembly for rotary drilling operations.

The ultra-low friction coatings on drill string assemblies disclosed herein may also eliminate or reduce the velocity weakening of the friction coefficient. More particularly, rotary drilling systems used to drill deep boreholes for hydrocarbon exploration and production often experience severe torsional vibrations leading to instabilities referred to as "stick-slip" vibrations, characterized by (i) sticking phases where the bit or BHA down to bit stops (relative sliding velocity is zero), and (ii) slipping phases where the relative sliding velocity of the above assembly downhole rapidly accelerates to a value much larger than the average sliding velocity imposed by the rotary speed (RPM) imposed at the drilling rig. This problem is particularly acute with drag bits, which consist of fixed blades or cutters mounted on the surface of a bit body. Non-linearities in the constitutive laws of friction lead to the instability of steady frictional sliding against stick-slip oscillations. In particular, velocity weakening behavior, which is indicated by a decreasing coefficient of friction with increasing relative sliding velocity, may cause torsional instability triggering stick-slip vibrations. Sliding instability is an issue in drilling since it is one of the primary founders which limits the maximum rate of penetration as described earlier. In drilling applications, it is advantageous to avoid the stick-slip condition because it leads to vibrations and wear, including the initiation of damaging coupled vibrations. By reducing or eliminating the velocity weakening behavior, the ultra-low friction coatings on drill string assemblies disclosed herein bring the system into the continuous sliding state, where the relative sliding velocity is constant and does not oscillate (avoidance of stick-slip) or display violent accelerations or decelerations in localized RPM. Even with the prior art method of avoiding stick-slip motion with the use of a lubricant additive or pills to drilling muds, at high normal loads and small sliding velocities stick-slip motion may still occur. The ultra-low friction coatings on drill stem assemblies disclosed herein may provide for no stick-slip motion even at high normal loads.

Bit and stabilizer balling occurs when the adhesive forces between the bit and stabilizer surface and rock cutting chips become greater than the cohesive forces holding the chip together. Therefore, in order to decrease bit balling, the adhesive forces between the deformable shale chip and the drill bit and stabilizer surface may be reduced. The ultra-low friction coatings on drill stem assemblies disclosed herein provide low energy surfaces to provide low adherence surfaces for mitigating or reducing bit/stabilizer balling.

Drill stem assemblies experience significant wear at the hardbanded regions since these are primary contact points between drill stem and casing or open borehole. The wear can be exacerbated by abrasive sand and rock particles becoming entrained in the interface and abrading the surfaces. Ultra-low friction coatings show high hardness properties to help mitigate abrasive wear. Using hardbanding that has a surface with a patterned design that promotes the flow of abrasive particles past the coated hardbanded region will reduce the amount of wear and damage to the coating and hardbanded portion of the component. Using ultra-low friction coatings in conjunction with patterned hardbanding will further reduce wear due to abrasive particles.

Methods for Reducing Friction in Drill Stem Assemblies:

The current disclosure also relates to methods for reducing friction and wear during subterraneous rotary drilling operations. In one exemplary embodiment, a method for reducing friction in a coated drill stem assembly during subterraneous rotary drilling operations includes providing a coated drill stem assembly including a body assembly with an exposed outer surface including a drill string coupled to a bottom hole assembly or a coiled tubing coupled to a bottom hole assembly or a casing string coupled to a bottom hole assembly, and an ultra-low friction coating on at least a portion of the exposed outer surface of the body assembly, and utilizing the coated drill stem assembly in subterraneous rotary drilling operations. The subterraneous rotary drilling operations may be directional including, but not limited to, horizontal drilling or extended reach drilling (ERD). During horizontal drilling or extended reach drilling (ERD), the method may also include utilizing bent motors to assist with weight transfer to the drill bit. Weight transfer to the drill bit is facilitated during sliding operations (0 RPM) for directional hole drilling when using such bent motors.

As discussed in detail above, the ultra-low friction coating may be chosen from an amorphous alloy, an electroless or electro plated based nickel-phosphorous composite with a phosphorous content greater than 12 wt %, graphite, $MoS_2$, $WS_2$, a fullerene based composite, a boride based cermet, a quasicrystalline material, a diamond based material, diamond-like-carbon (DLC), boron nitride, carbon nanotubes, graphene sheets, metallic particles of high aspect ratio (i.e. relatively long and thin), ring-shaped materials (e.g. carbon nanorings), oblong particles, and combinations thereof. The diamond based material may be chemical vapor deposited (CVD) diamond or polycrystalline diamond compact (PDC). In one advantageous embodiment, the coated drill stem assembly for subterraneous rotary drilling operations is coated with an ultra-low friction diamond-like-carbon (DLC) coating, and more particularly the DLC coating may be chosen from ta-C, ta-C:H, DLCH, PLCH, GLCH, Si-DLC, N-DLC, O-DLC, B-DLC, Me-DLC, F-DLC, S-DLC, and combinations thereof. In another advantageous form of the DLC coating embodiment, hardbanding is utilized adjacent to the substrate.

In one form of the method for reducing friction in a coated drill stem assembly during subterranean rotary drilling operations, the one or more components of the drill stem assembly may be coated with diamond-like carbon (DLC). Coatings of DLC materials may be applied by physical vapor deposition (PVD), arc deposition, chemical vapor deposition (CVD), or plasma enhanced chemical vapor deposition (PECVD) coating techniques. The physical vapor deposition coating method may be chosen from sputtering, RF-DC plasma reactive magnetron sputtering, ion beam assisted deposition, cathodic arc deposition and pulsed laser deposition. The one or more DLC coating layers may be advantageously deposited by PECVD and/or RF-DC plasma reactive magnetron sputtering methods.

The method for reducing friction in a coated drill stem assembly during subterranean rotary drilling operations disclosed herein provides substantial reduction in torque by substantially reducing friction and drag during directional or extended reach drilling facilitating drilling deeper and/or longer reach wells with existing top drive capabilities. Substantial reduction in torque means a 10% reduction, preferably 20% reduction, and more preferably 30% as compared to when an uncoated drill stem assembly is used for rotary drilling. Substantially reducing friction and drag means a 10% reduction, preferably 20% reduction, and more preferably 50% as compared to when an uncoated drill stem assembly is used for rotary drilling. The method for reducing friction in a coated drill stem assembly may further include applying the ultra-low friction coating on at least a portion of the exposed outer surface of the body assembly at the drilling rig site in the field or at a local supplier shop to apply new or refurbish worn coatings to extend the life and facilitate continued use of the assembly.

In one advantageous form of the method for reducing friction in a coated drill stem assembly during subterraneous rotary drilling operations disclosed herein, the ultra-low friction coating includes diamond-like-carbon (DLC). One exemplary method for applying the diamond-like-carbon (DLC) ultra-low friction coating includes evacuating at least a portion of the exposed outer surface of the body assembly through a means for mechanical sealing and pumping down prior to vapor deposition coating. Either a drill string or coiled tubing or casing string may be used in conjunction with the bottom hole assembly to form the drill stem assembly. When utilizing ultra-low friction coated coiled tubing in subterraneous rotary drilling operations with the methods for reducing friction disclosed herein, the method provides for underbalanced drilling to reach targeted total depth without the need for drag reducing additives in the mud.

When utilizing the ultra-low friction coated drill stem assemblies, the method for reducing friction in a coated drill stem assembly during subterranean rotary drilling operations disclosed herein, provides for substantial friction and drag reduction without compromising the aggressiveness of a drill bit connected to the coated drill stem assembly to transmit applied torque to rock fragmentation process. Substantial friction and drag reduction means that a 10% reduction, preferably 20% reduction and more preferably 50% reduction as compared to when an uncoated drill stem assembly is used for rotary drilling. In addition, the method for reducing friction in a coated drill stem assembly during subterraneous rotary drilling operations disclosed herein, the corrosion resistance of the ultra-low friction coating is at least equal to the steel used for the body assembly of the drill stem assembly in the downhole drilling environments.

Test Methods

Coefficient of friction was measured using a ball-on-disk tester according to ASTM G99 test method. The test method requires two specimens—a flat disk specimen and a spherically ended ball specimen. A ball specimen, rigidly held by using a holder, is positioned perpendicular to the flat disk. The flat disk specimen slides against the ball specimen by revolving the flat disk of 2.7 inches diameter in a circular path. The normal load is applied vertically downward through the ball so the ball is pressed against the disk. The specific normal load can be applied by means of attached weights, hydraulic or pneumatic loading mechanisms. During the testing, the frictional forces are measured using a tension-compression load cell or similar force-sensitive devices attached to the ball holder. The friction coefficient can be calculated from the measured frictional forces divided by normal loads. The test was done at room temperature and 150° F. under various testing condition sliding speeds. A quartz or mild steel ball, 4 mm~5 mm diameter, was utilized as a counterface material, and the coating material to be tested was applied to the disk component. The environment for reference conditions is oil-based drilling fluid at a sliding velocity of 0.6 m/s, with a 300 g load at 150° F. (see FIG. 9).

Velocity strengthening or weakening effects were evaluated by measuring the friction coefficient at various sliding velocities using the ball-on-disk friction test apparatus by ASTM G99 test method described above.

Hardness was measured according to ASTM C1327 Vickers hardness test method. The Vickers hardness test method consists of indenting the test material with a diamond indenter, in the form of a right pyramid with a square base and an angle of 136 degrees between opposite faces subjected to a load of 1 to 100 kgf. The full load is normally applied for 10 to 15 seconds. The two diagonals of the indentation left in the surface of the material after removal of the load are measured using a microscope and their average is calculated. The area of the sloping surface of the indentation is calculated. The Vickers hardness is the quotient obtained by dividing the kgf load by the square mm area of indentation. The advantages of the Vickers hardness test are that extremely accurate readings can be taken, and just one type of indenter is used for all types of metals and surface treatments. The hardness of thin coating layer (e.g., less than 100 μm) has been evaluated by nanoindentation wherein the normal load (P) is applied to a coating surface by an indenter with well-known pyramidal geometry (e.g., Berkovich tip, which has a three-sided pyramid geometry). In nanoindentation small loads and tip sizes are used to eliminate or reduce the effect from the substrate, so the indentation area may only be a few square micrometres or even nanometres. During the course of the nanoindentation process, a record of the depth of penetration is made, and then the area of the indent is determined using the known geometry of the indentation tip. The hardness can be obtained by dividing the load (kgf) by the area of indentation (square mm).

Wear performance was measured by the ball on disk geometry according to ASTM G99 test method. The amount of wear, or wear volume loss of the disk and ball is determined by measuring the dimensions of both specimens before and after the test. The depth or shape change of the disk wear track was determined by laser surface profilometry and atomic force microscopy. The amount of wear, or wear volume loss of the ball was determined by measuring the dimensions of specimens before and after the test. The wear volume of the ball was calculated from the known geometry and size of the ball.

Water contact angle was measured according to ASTM D5725 test method. The method referred to as "sessile drop method" uses a liquid contact angle goniometer that is based on an optical system to capture the profile of a pure liquid on a solid substrate. A drop of liquid (e.g., water) was placed (or allowed to fall from a certain distance) onto a solid surface. When the liquid settled (has become sessile), the drop retained its surface tension and became ovate against the solid surface. The angle formed between the liquid/solid interface and the liquid/vapor interface is the contact angle. The contact angle at which the oval of the drop contacts the surface determines the affinity between the two substances. That is, a flat drop indicates a high affinity, in which case the liquid is said to wet the substrate. A more rounded drop (by height) on top of the surface indicates lower affinity because the angle at which the drop is attached to the solid surface is greater. In this case the liquid is said not to wet the substrate. The sessile drop systems employ high resolution cameras and software to capture and analyze the contact angle.

Figure 17:
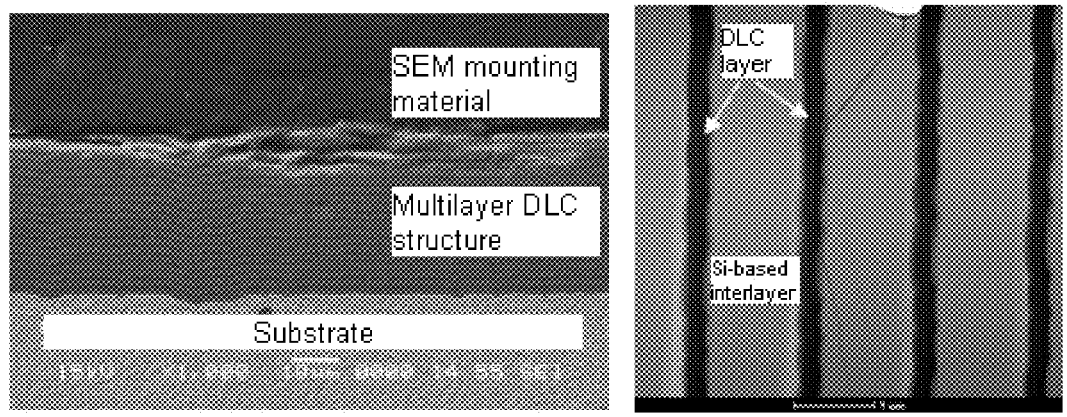
FIG. 17 depicts an exemplary image (left-SEM, right-HAADF-STEM) showing structure in a candidate multilayered DLC material.

Scanning Electron Microscopy (SEM) studies were performed on a SEM operated at an accelerating voltage of 15-20 kV. Specimens for SEM study were prepared by cross-sectioning of coated substrates, followed by metallographic specimen preparation techniques for observation. Scanning Transmission Electron Microscopy (STEM) studies were performed on a microscope operated at 300 kV, equipped with a High Resolution Electron Energy-Loss Spectrometer (EELS) for compositional analysis. Operation in the STEM mode enabled acquisition of High Angle Annular Dark Field (HAADF) and Bright Field (BF) STEM images of the coating architectures. An example SEM image and HAADF-STEM image of a candidate coating is shown in FIG. 17.

After initial tests using the ball-on-disk method, additional tests were conducted with a different contact geometry. Several combinations of hardbanded substrate materials and coatings were evaluated in the second phase of the laboratory test program. To better simulate drilling conditions, a small block is pushed against a ring of about 2-inches diameter and one-quarter inch width in a "block-on-ring" test. These tests are conducted using an apparatus obtained from the Center for Tribology Research (CETR) that is commonly available.

Testing of drilling tool-joints was conducted using industry-standard test equipment in a number of configurations of substrate and coating materials. These tests were conducted at MOHR Engineering in Houston, Tex. Several coatings were applied to both steel and hardbanded rings of the same dimensions as a tool-joint. In this test, outer rings of casing material or sandstone are pushed against the coated joint that turns in a lathe fixture. At the same time, the outer ring reciprocates axially, and drilling mud is sprayed at the interface between the two bodies using nozzles and a circulating system.

The data from these test programs has guided the research direction prior to actual field testing of coated components and facilitated the understanding of those combinations of materials and application methods that would most likely be successful in a production environment.

EXAMPLES

Illustrative Example 1

Figure 7:
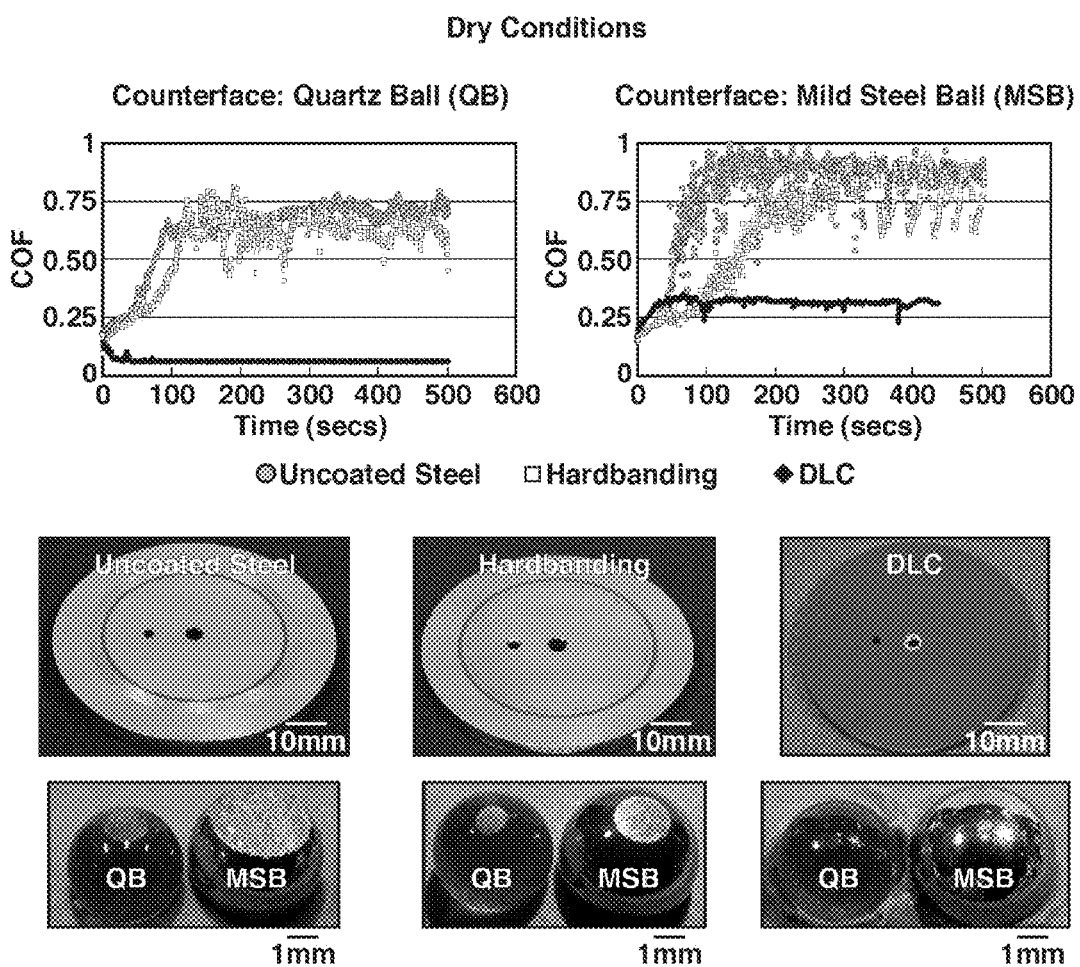
FIG. 7 depicts the friction and wear performance of DLC coating at dry sliding wear test.

DLC coatings were applied on 4142 steel substrates by vapor deposition technique. DLC coatings had a thickness ranging from 1.5 to 25 micrometers. The hardness was measured to be in the range of 1,300 to 7,500 Vickers Hardness Number. Laboratory tests based on ball on disk geometry were conducted to demonstrate the friction and wear performance of the coating. Quartz ball and mild steel ball were used as counterface materials to simulate open hole and cased hole conditions respectively. In one ambient temperature test, uncoated 4142 steel, DLC coating and commercial state-of-the-art hardbanding weld overlay coating were tested in "dry" or ambient air condition against quartz counterface material at 300 g normal load and 0.6 m/sec sliding speed to simulate an open borehole condition. Up to 10 times improvement in friction performance (reduction of friction coefficient) over uncoated 4142 steel and hardbanding could be achieved in DLC coatings as shown in FIG. 7.

In another ambient temperature test, uncoated 4142 steel, DLC coating and commercial state-of-the-art hardbanding weld overlay coating were tested against mild steel counterface material to simulate a cased hole condition. Up to three times improvement in friction performance (reduction of friction coefficient) over uncoated 4142 steel and hardbanding could be achieved in DLC coatings as shown in FIG. 7. The DLC coating polished the quartz ball due to higher hardness of DLC coating than that of counterface materials (i.e., quartz and mild steel). However, the volume loss due to wear was minimal in both quartz ball and mild steel ball. On the other hand, the plain steel and hardbanding caused significant wear in both the quartz and mild steel balls, indicating that these are not very "casing friendly".

Figure 8:
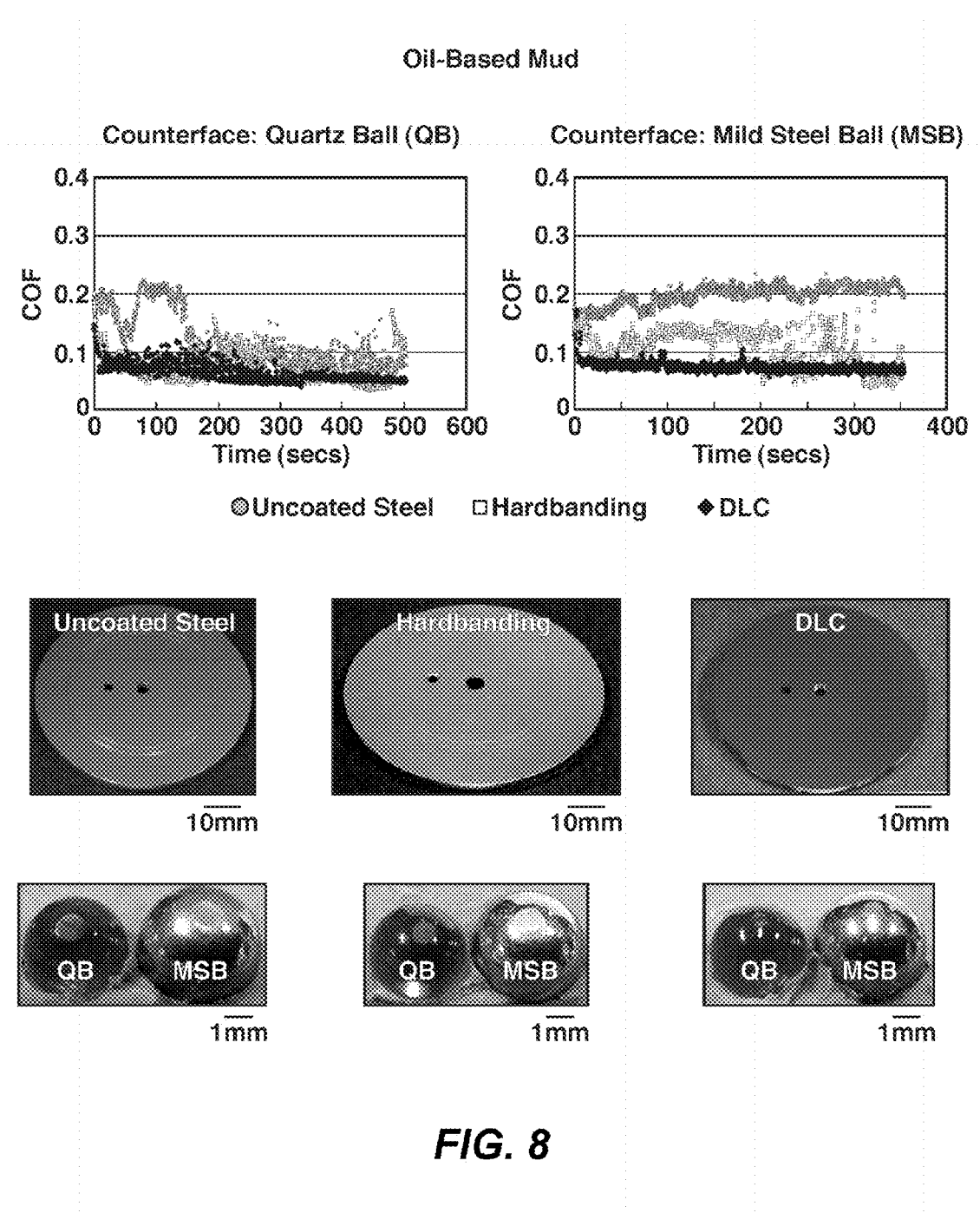
FIG. 8 depicts the friction and wear performance of the DLC coating in oil based mud.

Ball-on-disk wear and friction coefficient were also tested at ambient temperature in oil based mud. Quartz ball and mild steel balls were used as counterface materials to simulate open hole and cased hole respectively. The DLC coating exhibited significant advantages over commercial hardbanding as shown in FIG. 8. Up to 30% improvement in friction performance (reduction of friction coefficient) over uncoated 4142 steel and hardbanding could be achieved with DLC coatings. The DLC coating polished the quartz ball due to its higher hardness than that of quartz. On the other hand, for the case of uncoated steel disk, both the mild steel and quartz balls as well as the steel disc showed significant wear. For a comparable test, the wear behavior of hardbanded disk was intermediate to that of DLC coated disc and the uncoated steel disc.

Figure 9:
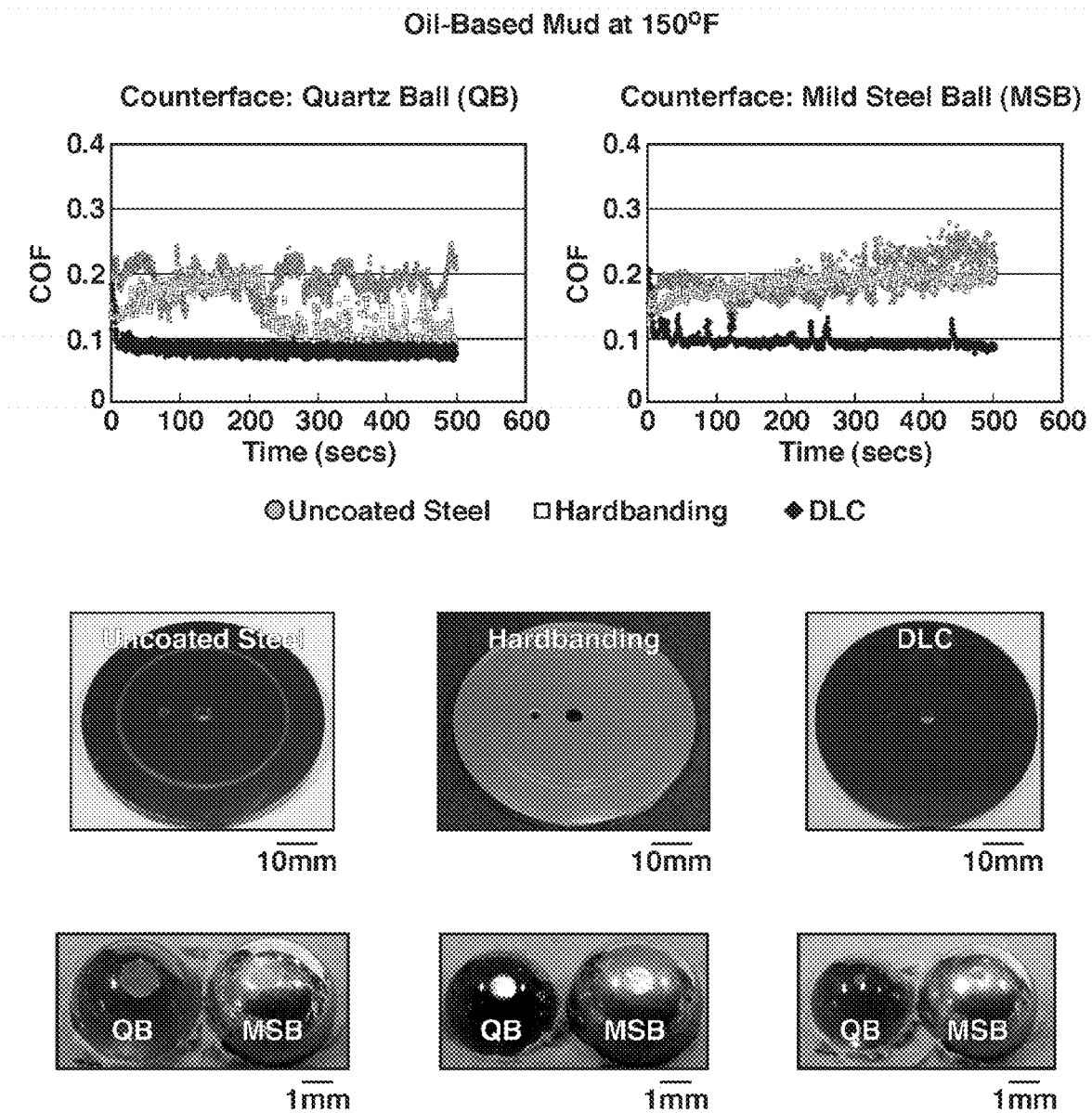
FIG. 9 depicts the friction and wear performance of DLC coating at elevated temperature (150° F.) sliding wear test in oil based mud.

FIG. 9 depicts the wear and friction performance at elevated temperatures. The tests were carried out in oil based mud heated to 150° F., and again the quartz ball and mild steel ball were used as counterface materials to simulate an open hole and cased hole condition respectively. DLC coatings exhibited up to 50% improvement in friction performance (reduction of friction coefficient) over uncoated 4142 steel and commercial hardbanding. Uncoated steel and hardbanding caused wear damage in the counterface materials of quartz and mild steel balls, whereas, significantly less wear damage has been observed in the counterface materials rubbed against the DLC coating.

Figure 10:
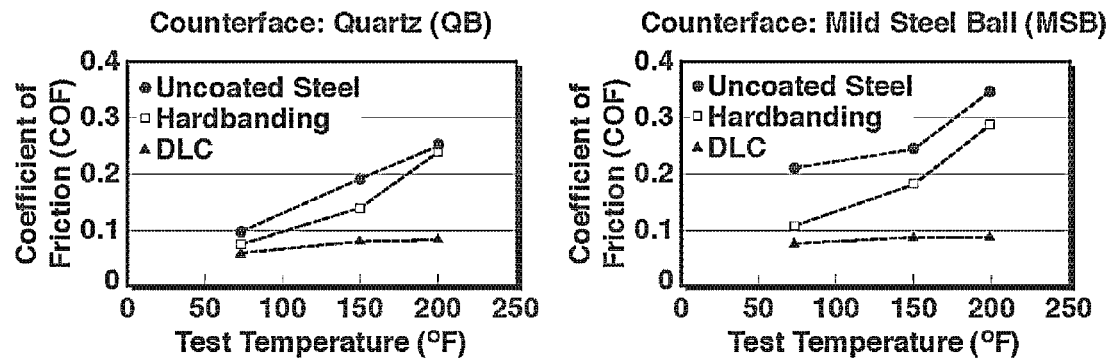
FIG. 10 shows the friction performance of DLC coatings at elevated temperature in oil based mud.

FIG. 10 shows the friction performance of DLC coating at elevated temperature (150° F. and 200° F.) in oil based mud. In this test data, the DLC coatings exhibited low friction coefficient at elevated temperature up to 200° F. However, the friction coefficient of uncoated steel and hardbanding increased significantly with temperature.

Illustrative Example 2

Figure 11:
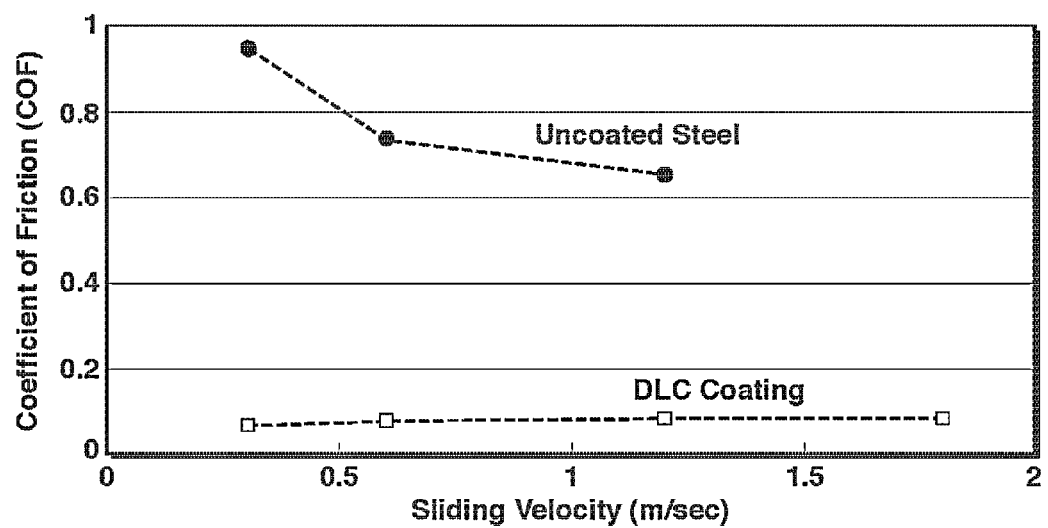
FIG. 11 compares the velocity-weakening performance of DLC coating with the uncoated bare steel substrate.

In the laboratory wear/friction testing, the velocity dependence (velocity weakening or strengthening) of the friction coefficient for a DLC coating and uncoated 4142 steel was measured by monitoring the shear stress required to slide at a range of sliding velocity of 0.3 m/sec-1.8 m/sec. Quartz ball was used as a counterface material in the dry sliding wear test. The velocity-weakening performance of the DLC coating relative to uncoated steel is depicted in FIG. 11. Uncoated 4142 steel exhibits a decrease of friction coefficient with sliding velocity (i.e. significant velocity weakening), whereas DLC coatings show no velocity weakening and indeed, there seems to be a slight velocity strengthening of COF (i.e. slightly increasing COF with sliding velocity), which may be advantageous for mitigating torsional instability, a precursor to stick-slip vibrations.

Illustrative Example 3

Figure 12:
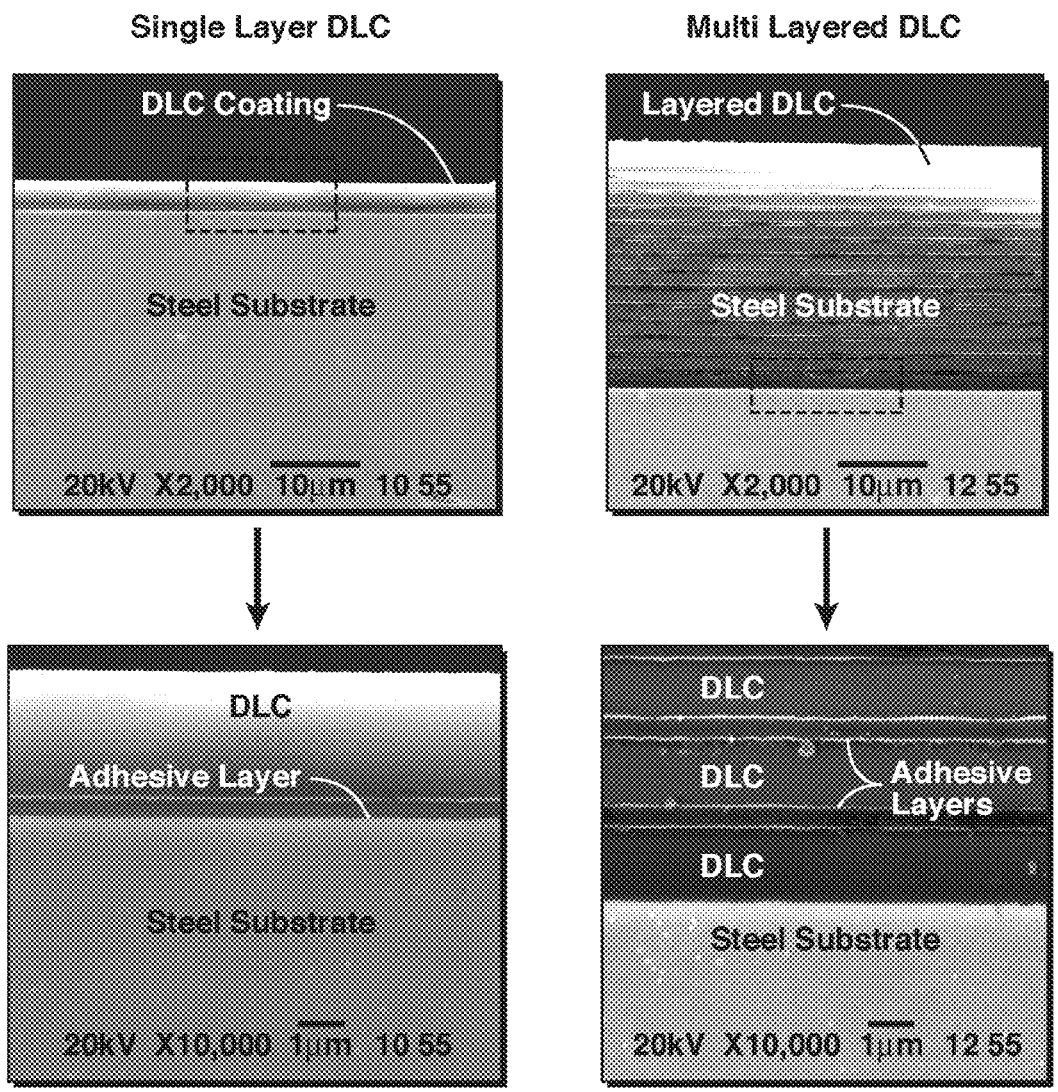
FIG. 12 depicts SEM cross-sections of single layer and multi-layered DLC coatings disclosed herein.

Multi-layered DLC coatings were produced in order to maximize the thickness of the DLC coatings to enhance their durability. In one form, the total thickness of the multi-layered DLC coating varied from 6 µm to 25 µm. FIG. 12 depicts SEM images of both single layer and multilayer DLC coatings for drill stem assemblies produced via PECVD. Buffer layers, also known as adhesive layers, were used with the DLC coatings. In this case, the buffer layer material contained silicon.

Illustrative Example 4

Figure 13:
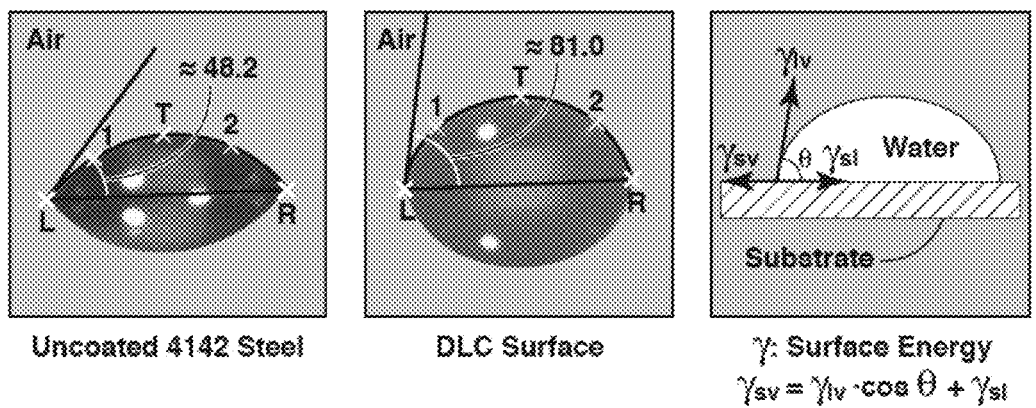
FIG. 13 depicts water contact angle for DLC coatings versus uncoated 4142 steel.

The surface energy of DLC coated substrates in comparison to an uncoated 4142 steel surface was measured via water contact angle. Results are depicted in FIG. 13 and indicate that a DLC coating provides a substantially lower surface energy in comparison to an uncoated steel surface. The lower surface energy may provide lower adherence surfaces for mitigating or reducing bit/stabilizer balling and to prevent formation of deposits of asphaltenes, paraffins, scale, and/or hydrates.

Illustrative Example 5

Figure 15:
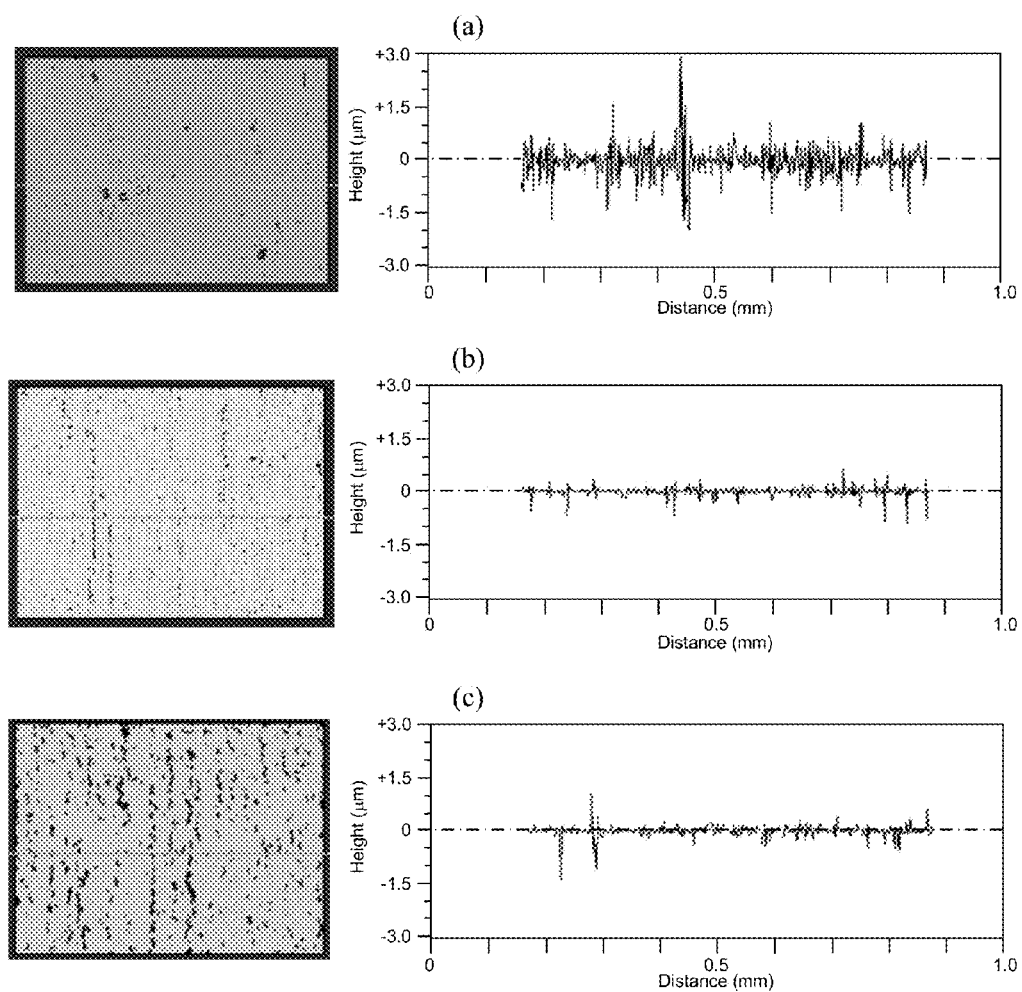
FIG. 15 depicts the roughness results obtained using an optical profilometer from the following: a) unpolished ring; b) polished ring; and c) Ni—P buttering layer/DLC coated ring, where optical images of the scanned area are shown on the left and surface profiles are shown on the right.

The roughness of unpolished, polished, and Ni—P plated rings are shown in FIG. 15. More particularly, FIG. 15 depicts roughness results obtained using an optical profilometer, which works based on the white light interferometry technique, from: a) unpolished ring; b) super-polished ring; and c) un-polished DLC coated ring with Ni—P buttering layer. Optical images of the scanned area are shown on the left and surface profiles are shown on the right. Scanning was performed three times on each sample in an area of 0.53 mm by 0.71 mm. The roughness of the unpolished ring appeared to be quite high ($R_a$ ~0.28 µm). The super-polished ring had almost one order of magnitude lower roughness ($R_a$ ~0.06 µm) than the unpolished ring. The electroless Ni—P plating on an unpolished ring provided about the same level of roughness ($R_a$ ~0.08 µm) as the super-polished ring. This demonstrates that the deposition of a Ni—P buttering layer on a rough surface can improve the surface smoothness, and hence it may help avoid time consuming super-polishing steps prior to depositing ultra-low friction coatings.

Illustrative Example 6

Figure 16:
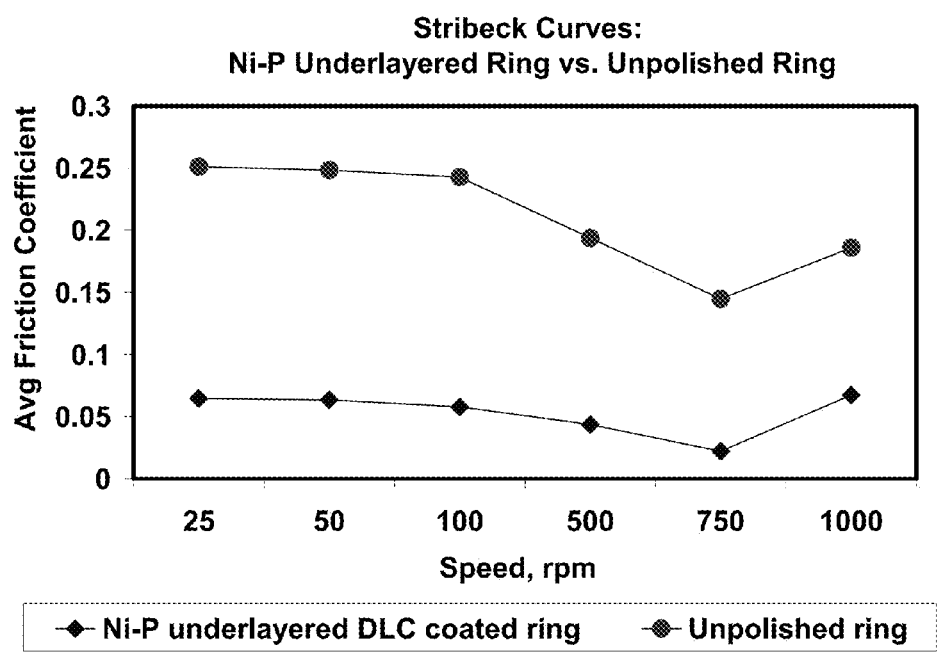
FIG. 16 depicts the average friction coefficient as a function of speed for Ni—P buttering layer/DLC coated ring and unpolished bare ring.

Friction and wear results for a bare unpolished ring versus a Ni—P buttering layer/DLC coated ring are shown in FIG. 16. More specifically, FIG. 16 depicts the average friction coefficient as a function of speed for Ni—P buttering layer/DLC coated ring and bare unpolished ring. Tribological tests were performed in a block-on-ring (BOR) tribometer. An oil based mud with 2% sand was used as a lubricant for the test. Tests were run at room temperature but other conditions (speed and load) were varied for different tests designed to evaluate friction and durability performance of the coated rings. The friction as a function of speed, which is also known as a Stribeck Curve, is shown in FIG. 16. Stribeck curves are typically used to demonstrate the friction response as a function of contact severity under lubricated conditions. In all cases, the Stribeck curve for the Ni—P buttering layer/DLC coated ring showed much lower friction both at low and high speed than the bare unpolished ring. Hence, it is evident that the Ni—P buttering layer that helped reduce surface roughness also provided significant friction benefit compared to the bare unpolished ring of higher roughness.

Illustrative Example 7

Figure 18:
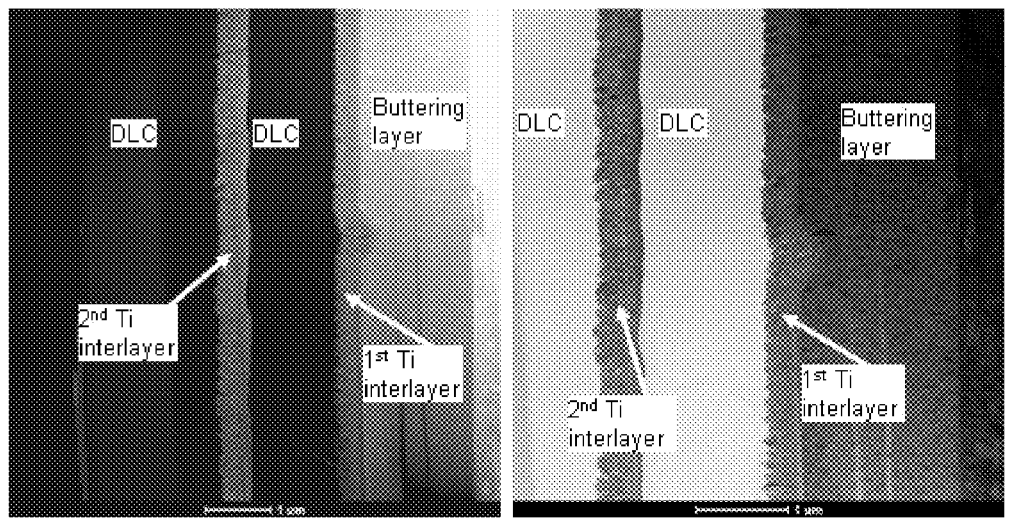
FIG. 18 depicts an HAADF-STEM (left) and Bright-Field STEM (right) image showing a 2-period Ti-DLC structure.
Figure 19:
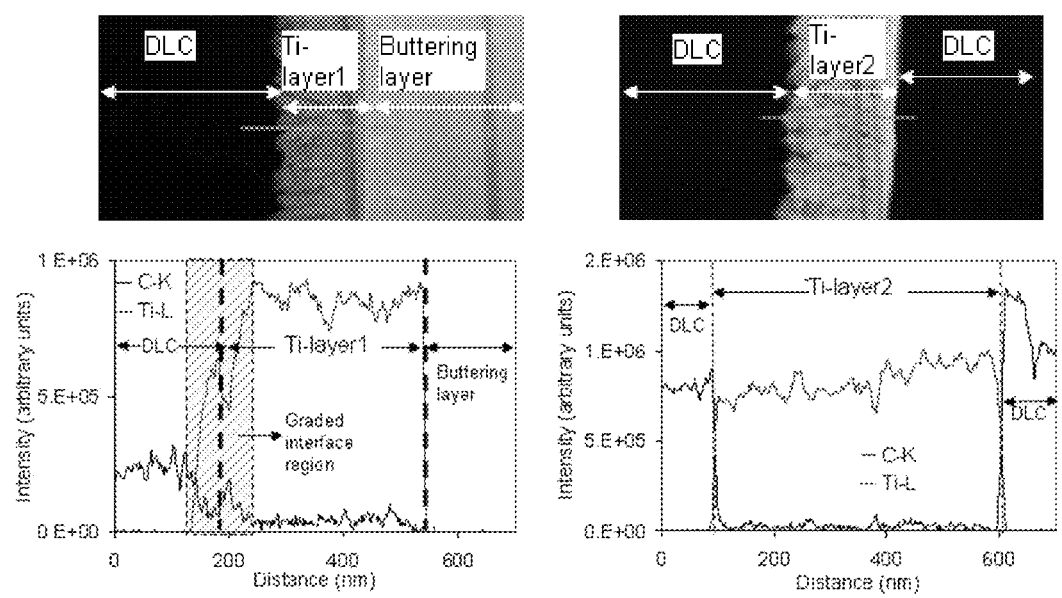
FIG. 19 depicts EELS (electron energy-loss spectroscopy) composition profiles showing the compositionally graded interface between Ti-layer 1 and DLC and the abrupt compositional transition at the interface between Ti-layer 2 and DLC.
Figure 20:
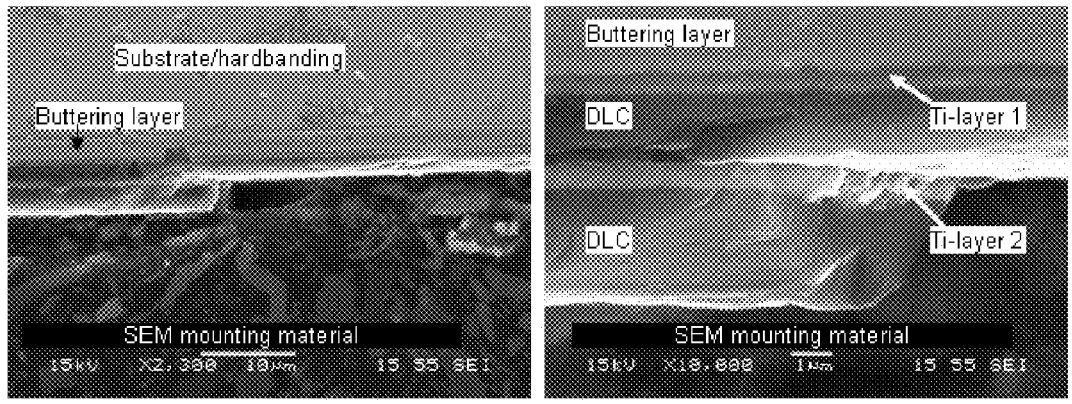
FIG. 20 depicts SEM images showing failure occurring through delamination at the interface between the DLC and the $2^{nd}$ titanium buffer layer.

As an example, a 2-period DLC-buffer layer structure (with Ti as the buffer layer material) was created where the first Ti buffer layer was deposited using a graded interface approach (e.g. between the DLC layer and first Ti buffer layer). The second Ti buffer layer was created with a non-graded interface. The overall multilayer structure is shown in FIG. 18. The graded interface at the first Ti buffer layer/DLC interface, and non-graded interface between the second Ti buffer layer/DLC interface is shown in FIG. 19. More specifically, FIG. 18 shows High Angle Annular Dark Field (HAADF)-Scanning Transmission Electron Microscopy (STEM) image on the left and Bright-Field STEM image on the right disclosing the 2-period Ti-DLC structure. FIG. 19 depicts Electron Energy-Loss Spectroscopy (EELS) composition profiles showing the graded buffer layer interface between Ti-layer 1 and DLC (left top and bottom) and the non-graded interface between Ti-layer 2 and DLC (right top and bottom). This 2-period DLC structure was coated on ring-shaped samples of appropriate geometry and tested under lab-scale (CETR-BOR) and large-scale (MOHR) testing conditions. Post-mortem analysis of the tested samples showed failure occurring through delamination at the non-graded interface between the $2^{nd}$ titanium buffer layer and the DLC layer. This suggests that the creation of graded interfaces allows for improved interfacial adhesion performance. Representative images of the tested sample are shown in FIG. 20. More specifically, FIG. 20 depicts SEM images showing failure occurring through delamination at the non-graded interface between the DLC and the $2^{nd}$ Titanium buffer layer. The thicknesses of the interfaces were measured as the length span between the 5% and 95% values of the limiting titanium intensity counts in each layer. The non-graded interfaces had thicknesses less than 20 nm, whereas the graded interfaces had thicknesses greater than 100 nm. An improvement in performance was observed in MOHR tests for the DLC structure with a graded interface, through preservation of the first DLC layer. The above structure successfully withstood side loads of 3500 lbf in large-scale MOHR tests—other coatings not engineered in similar fashion were not able to withstand this level of loading, leading to coating failure.

Illustrative Example 8

Figure 21:
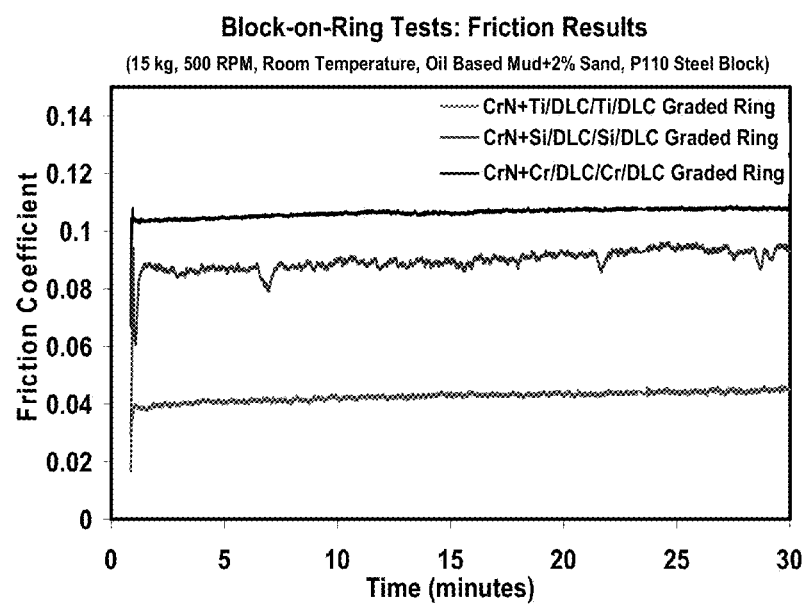
FIG. 21 depicts the friction response as a function of time for several coating buffer layer types at a given test condition.

The tribological performance of DLC coatings with various buffer layers are discussed below. Durability and wear tests were performed in a block-on-ring (BOR) tribometer. FIG. 21 shows friction coefficient results as a function of time for a given test condition. Results reveal the differences in friction response with the selection of buffer layer for the same DLC coating. The DLC coating with Ti buffer layer provided the lowest friction. In addition, DLC coatings with Si and Cr buffer layers also provided quite low friction (~0.1 or less) and in all cases friction largely remained stable throughout the test. The block wear for the corresponding ring samples as shown in Table 1 below appeared to be in the same range suggesting that the change in contact pressure was not significant, and hence the block wear had no apparent influence on the friction response.

TABLE 1

Block wear results:

| Rings ran against the block | Wear scar width on the block |
|---|---|
| CrN + Ti/DLC/Ti/DLC Graded Ring | 3.1 mm |
| CrN + Si/DLC/Si/DLC Graded Ring | 2.1 mm |
| CrN + Cr/DLC/Cr/DLC Graded Ring | 3.7 mm |

Applicants have attempted to disclose all embodiments and applications of the disclosed subject matter that could be reasonably foreseen. However, there may be unforeseeable, insubstantial modifications that remain as equivalents. While the present disclosure has been described in conjunction with specific, exemplary embodiments thereof, it is evident that many alterations, modifications, and variations will be apparent to those skilled in the art in light of the foregoing description without departing from the spirit or scope of the present disclosure. Accordingly, the present disclosure is intended to embrace all such alterations, modifications, and variations of the above detailed description.

All patents, test procedures, and other documents cited herein, including priority documents, are fully incorporated by reference to the extent such disclosure is not inconsistent with this disclosure and for all jurisdictions in which such incorporation is permitted.

When numerical lower limits and numerical upper limits are listed herein, ranges from any lower limit to any upper limit are contemplated.

What is claimed is:

1. A coated drill stem assembly for subterraneous rotary drilling operations comprising:
   a body assembly with an exposed outer surface including a drill string coupled to a bottom hole assembly, a coiled tubing coupled to a bottom hole assembly, or a casing string coupled to a bottom hole assembly,
   hardbanding on at least a portion of the exposed outer surface of the body assembly,
   an ultra-low friction coating on at least a portion of the hardbanding,
   wherein the ultra-low friction coating comprises one or more ultra-low friction layers,
   and one or more buttering layers interposed between the hardbanding and the ultra-low friction coating.

2. The coated drill stem assembly of claim 1 wherein the hardbanding has a patterned surface.

3. The coated drill stem assembly of claim 2 wherein the patterned hardbanding surface includes recessed and raised features that range from 1 mm to 5 mm in depth.

4. The coated drill stem assembly of claim 3 wherein the recessed features comprise 10% to 90% of the area in the hardbanding region.

5. The coated drill stem assembly of claim 2 wherein the hardbanding has a pattern chosen from lateral grooves or slots, longitudinal grooves or slots, angled grooves or slots, spiral grooves or slots, chevron shaped grooves or slots, recessed dimples, proud dimples, and combinations thereof.

6. The coated drill stem assembly of claim 1 wherein the ultra-low friction coating further comprises one or more buffer layers.

7. The coated drill stem assembly of claim 1 or claim 6 wherein at least one of the layers is graded, or at least one of an interface between adjacent layers is graded, or combinations thereof.

8. The coated drill stem assembly of claim 1, wherein the one or more ultra-low friction layers are chosen from an amorphous alloy, an electroless nickel-phosphorous composite, graphite, $MoS_2$, $WS_2$, a fullerene based composite, a boride based cermet, a quasicrystalline material, a diamond based material, diamond-like-carbon (DLC), boron nitride, carbon nanotubes, graphene sheets, metallic particles of high aspect ratio, ring-shaped materials including carbon nanorings, oblong particles, and combinations thereof.

9. The coated drill stem assembly of claim 8, wherein the diamond based material is chemical vapor deposited (CVD) diamond or polycrystalline diamond compact (PDC).

10. The coated drill stem assembly of claim 1, wherein at least one ultra-low friction layer is diamond-like-carbon (DLC).

11. The coated drill stem assembly of claim 10, wherein the diamond-like-carbon (DLC) is chosen from ta-C, ta-C:H, DLCH, PLCH, GLCH, Si-DLC, Ti-DLC, Cr-DLC, N-DLC, O-DLC, B-DLC, Me-DLC, F-DLC, S-DLC and combinations thereof.

12. The coated drill stem assembly of claim 1, wherein the ultra-low friction coating provides a surface energy less than 1 $J/m^2$.

13. The coated drill stem assembly of claim 1, wherein the ultra-low friction coating on at least a portion of the exposed outer surface of the body assembly provides a hardness greater than 400 VHN.

14. The coated drill stem assembly of claim 1, wherein the coefficient of friction of the coating is less than or equal to 0.15.

15. The coated drill stem assembly of claim 1, wherein the coating provides at least 3 times greater wear resistance than an uncoated drill stem assembly.

16. The coated drill stem assembly of claim 1, wherein a water contact angle of the ultra-low friction coating is greater than 60 degrees.

17. The coated drill stem assembly of claim 1 or 6 wherein a thickness of the ultra-low friction coating ranges from 0.5 microns to 5000 microns.

18. The coated drill stem assembly of claim 1 or 6 wherein thicknesses of the one or more ultra-low friction, buttering, and buffer layers is between 0.001 and 5000 microns.

19. The coated drill stem assembly of claim 7 wherein thicknesses of the one or more interfaces are between 0.01 to 10 microns or between 5% to 95% of a thickness of the thinnest adjacent layer.

20. The coated drill stem assembly of claim 6, wherein the one or more buffer layers are chosen from elements, alloys, carbides, nitrides, carbo-nitrides, borides, sulfides, silicides, and oxides of silicon, aluminum, copper, molybdenum, titanium, chromium, tungsten, tantalum, niobium, vanadium, zirconium, hafnium, and combinations thereof.

21. The coated drill stem assembly of claim 1, wherein the hardbanding comprises cermet based materials; metal matrix composites; nanocrystalline metallic alloys; amorphous alloys; hard metallic alloys; carbides, nitrides, borides, or oxides of elemental tungsten, titanium, niobium, molybdenum, iron, chromium, and silicon dispersed within a metallic alloy matrix; or combinations thereof.

22. The coated drill stem assembly of claim 1, wherein the one or more buttering layers comprise a stainless steel, a chrome-based alloy, an iron-based alloy, a cobalt-based alloy, a titanium-based alloy, or a nickel-based alloy, alloys or carbides or nitrides or carbo-nitrides or borides or silicides or sulfides or oxides of the following elements: silicon, titanium, chromium, aluminum, copper, iron, nickel, cobalt, molybdenum, tungsten, tantalum, niobium, vanadium, zirconium, hafnium, or combinations thereof.

23. The coated drill stem assembly of claim 1, wherein the one or more buttering layers is formed by one or more processes chosen from: PVD, PACVD, CVD, ion implantation, carburizing, nitriding, boronizing, sulfiding, siliciding, oxidizing, an electrochemical process, an electroless plating process, a thermal spray process, a kinetic spray process, a laser-based process, a friction-stir process, a shot peening process, a laser shock peening process, a welding process, a brazing process, an ultra-fine superpolishing process, a tribochemical polishing process, an electrochemical polishing process, and combinations thereof.

24. The coated drill stem assembly of claim 1, wherein the one or more buttering layers provide an ultra-smooth surface finish of average surface roughness lower than 0.25 micron.

25. The coated drill stem assembly of claim 1 wherein at least one of the buttering layers has a minimum hardness of 400 VHN.

26. A coated drill stem assembly for subterraneous rotary drilling operations comprising:
a body assembly with an exposed outer surface including a drill string coupled to a bottom hole assembly, a coiled tubing coupled to a bottom hole assembly, or a casing string coupled to a bottom hole assembly,
an ultra-low friction coating on at least a portion of the body assembly,
wherein the ultra-low friction coating comprises one or more ultra-low friction layers,
and one or more buttering layers interposed between the body assembly and the ultra-low friction coating,
wherein at least one of the buttering layers has a minimum hardness of 400 VHN.

27. The coated drill stem assembly of claim 26 wherein the ultra-low friction coating further comprises one or more buffer layers.

28. The coated drill stem assembly of claim 26 or claim 27 wherein at least one of the layers is graded, or at least one of the interfaces between adjacent layers is graded, or combinations thereof.

29. The coated drill stem assembly of claim 26, wherein the one or more ultra-low friction layers are chosen from an amorphous alloy, an electroless nickel-phosphorous composite, graphite, $MoS_2$, $WS_2$, a fullerene based composite, a boride based cermet, a quasicrystalline material, a diamond based material, diamond-like-carbon (DLC), boron nitride, carbon nanotubes, graphene sheets, metallic particles of high aspect ratio, ring-shaped materials including carbon nanorings, oblong particles, and combinations thereof.

30. The coated drill stem assembly of claim 29, wherein the diamond based material is chemical vapor deposited (CVD) diamond or polycrystalline diamond compact (PDC).

31. The coated drill stem assembly of claim 26, wherein at least one ultra-low friction layer is diamond-like-carbon (DLC).

32. The coated drill stem assembly of claim 31, wherein the diamond-like-carbon (DLC) is chosen from ta-C, ta-C:H, DLCH, PLCH, GLCH, Si-DLC, Ti-DLC, Cr-DLC, N-DLC, O-DLC, B-DLC, Me-DLC, F-DLC, S-DLC, and combinations thereof.

33. The coated drill stem assembly of claim 26, wherein the ultra-low friction coating provides a surface energy less than 1 $J/m^2$.

34. The coated drill stem assembly of claim 26, wherein the ultra-low friction coating on at least a portion of the exposed outer surface of the body assembly provides a hardness greater than 400 WIN.

35. The coated drill stem assembly of claim 26, wherein the coefficient of friction of the coating is less than or equal to 0.15.

36. The coated drill stem assembly of claim 26, wherein the coating provides at least 3 times greater wear resistance than an uncoated drill stem assembly.

37. The coated drill stem assembly of claim 26, wherein the water contact angle of the ultra-low friction coating is greater than 60 degrees.

38. The coated drill stem assembly of claim 26 or 27 wherein the thickness of the ultra-low friction coating ranges from 0.5 microns to 5000 microns.

39. The coated drill stem assembly of claim 26 or 27 wherein the thicknesses of the one or more layers are between 0.001 and 5000 microns.

40. The coated drill stem assembly of claim 28 wherein the thicknesses of the one or more interfaces are between 0.01 to 10 microns or between 5% to 95% of the thickness of the thinnest adjacent layer.

41. The coated drill stem assembly of claim 27, wherein the one or more buffer layers are chosen from elements, alloys, carbides, nitrides, carbo-nitrides, borides, sulfides, silicides, and oxides of silicon, aluminum, copper, molybdenum, titanium, chromium, tungsten, tantalum, niobium, vanadium, zirconium, hafnium, or combinations thereof.

42. The coated drill stem assembly of claim 26, wherein one or more exposed outer surfaces further includes hardbanding on at least a portion thereof.

43. The coated drill stem assembly of claim 42, wherein the hardbanding comprises cermet based materials; metal matrix composites; nanocrystalline metallic alloys; amorphous alloys; hard metallic alloys; carbides, nitrides, borides, or oxides of elemental tungsten, titanium, niobium, molybdenum, iron, chromium, and silicon dispersed within a metallic alloy matrix; or combinations thereof.

44. The coated drill stem assembly of claim 42 wherein the hardbanding has a patterned surface.

45. The coated drill stem assembly of claim 44 wherein the patterned hardbanding surface includes recessed and raised features that range from 1 mm to 5 mm in depth.

46. The coated drill stem assembly of claim 45 wherein the recessed features comprise 10% to 90% of the area in the hardbanding region.

47. The coated drill stem assembly of claim 44 wherein the hardbanding has a pattern chosen from: lateral grooves or slots, longitudinal grooves or slots, angled grooves or slots, spiral grooves or slots, chevron shaped grooves or slots, recessed dimples, proud dimples, and combinations thereof.

48. The coated drill stem assembly of claim 26, wherein the one or more buttering layers comprise a stainless steel, a chrome-based alloy, an iron-based alloy, a cobalt-based alloy, a titanium-based alloy, or a nickel-based alloy, alloys or carbides or nitrides or carbo-nitrides or borides or silicides or sulfides or oxides of the following elements: silicon, titanium, chromium, aluminum, copper, iron, nickel, cobalt, molybdenum, tungsten, tantalum, niobium, vanadium, zirconium, hafnium, or combinations thereof.

49. The coated drill stem assembly of claim 26, wherein the one or more buttering layers is formed by one or more processes chosen from: PVD, PACVD, CVD, carburizing, nitriding, boronizing, sulfiding, siliciding, oxidizing, an electrochemical process, an electroless plating process, a thermal spray process, a kinetic spray process, a laser-based process, a friction-stir process, a shot peening process, a laser shock peening process, a welding process, a brazing process, an ultra-fine superpolishing process, a tribochemical polishing process, an electrochemical polishing process, and combinations thereof.

50. The coated drill stem assembly of claim 26, wherein the one or more buttering layers provide an ultra-smooth surface finish of average surface roughness lower than 0.25 micron.

51. A method for reducing friction in a coated drill stem assembly during subterranean rotary drilling operations comprising:
providing a coated drill stem assembly comprising a body assembly with an exposed outer surface including a drill string coupled to a bottom hole assembly, a coiled tubing coupled to a bottom hole assembly, or a casing string coupled to a bottom hole assembly, hardbanding on at least a portion of the exposed outer surface of the body assembly, and an ultra-low friction coating on at least a portion of the hardbanding, wherein the ultra-low friction coating comprises one or more ultra-low friction layers, and one or more buttering layers interposed between the hardbanding and the ultra-low friction coating, and
utilizing the coated drill stem assembly in subterraneous rotary drilling operations.

52. The method of claim 51 wherein the hardbanding has a patterned surface.

53. The method of claim 52 wherein the patterned hardbanding surface includes recessed and raised features that range from 1 mm to 5 mm in depth.

54. The method of claim 53 wherein recessed features comprise 10% to 90% of the area in the hardbanding region.

55. The method of claim 52 wherein the hardbanding has a pattern chosen from lateral grooves or slots, longitudinal grooves or slots, angled grooves or slots, spiral grooves or slots, chevron shaped grooves or slots, recessed dimples, proud dimples, and combinations thereof.

56. The method of claim 51 wherein the ultra-low friction coating further comprises one or more buffer layers.

57. The method of claim 51 or claim 56 wherein at least one of the layers is graded, or at least one of the interfaces between adjacent layers is graded, or combinations thereof.

58. The method of claim 51, wherein the one or more ultra-low friction layers are chosen from an amorphous alloy, an electroless nickel-phosphorous composite, graphite, $MoS_2$, $WS_2$, a fullerene based composite, a boride based cermet, a quasicrystalline material, a diamond based material, diamond-like-carbon (DLC), boron nitride, carbon nanotubes, graphene sheets, metallic particles of high aspect ratio, ring-shaped materials including carbon nanorings, oblong particles, and combinations thereof.

59. The method of claim 58, wherein the diamond based material is chemical vapor deposited (CVD) diamond or polycrystalline diamond compact (PDC).

60. The method of claim 51, wherein at least one ultra-low friction layer is diamond-like-carbon (DLC).

61. The method of claim 60, wherein the diamond-like-carbon (DLC) is chosen from ta-C, ta-C:H, DLCH, PLCH, GLCH, Si-DLC, Ti-DLC, Cr-DLC, N-DLC, O-DLC, B-DLC, Me-DLC, F-DLC, S-DLC, and combinations thereof.

62. The method of claim 51, wherein the ultra-low friction coating provides a surface energy less than 1 $J/m^2$.

63. The method of claim 51, wherein the ultra-low friction coating on at least a portion of the exposed outer surface of the body assembly provides a hardness greater than 400 VHN.

64. The method of claim 51, wherein the coefficient of friction of the coating is less than or equal to 0.15.

65. The method of claim 51, wherein the coating provides at least 3 times greater wear resistance than an uncoated drill stem assembly.

66. The method of claim 51, wherein a water contact angle of the ultra-low friction coating is greater than 60 degrees.

67. The method of claim 51 or 56 wherein a thickness of the ultra-low friction coating ranges from 0.5 microns to 5000 microns.

68. The method of claim 51 or 56 wherein thicknesses of the one or more ultra-low friction, buttering, and buffer layers is between 0.001 and 5000 microns.

69. The method of claim 57 wherein thicknesses of the one or more interfaces are between 0.01 to 10 microns or between 5% to 95% of a thickness of the thinnest adjacent layer.

70. The method of claim 56, wherein the one or more buffer layers are chosen from elements, alloys, carbides, nitrides, carbo-nitrides, borides, sulfides, silicides, and oxides of silicon, aluminum, copper, molybdenum, titanium, chromium, tungsten, tantalum, niobium, vanadium, zirconium, hafnium, and combinations thereof.

71. The method of claim 51, wherein the hardbanding comprises cermet based materials; metal matrix composites; nanocrystalline metallic alloys; amorphous alloys; hard metallic alloys; carbides, nitrides, borides, or oxides of elemental tungsten, titanium, niobium, molybdenum, iron, chromium, and silicon dispersed within a metallic alloy matrix; or combinations thereof.

72. The method of claim 51, wherein the one or more buttering layers comprise a stainless steel, a chrome-based alloy, an iron-based alloy, a cobalt-based alloy, a titanium-based alloy, or a nickel-based alloy, alloys or carbides or nitrides or carbo-nitrides or borides or silicides or sulfides or oxides of the following elements: silicon, titanium, chromium, aluminum, copper, iron, nickel, cobalt, molybdenum, tungsten, tantalum, niobium, vanadium, zirconium, hafnium, or combinations thereof.

73. The method of claim 51, wherein the one or more buttering layers is formed by one or more processes chosen from: PVD, PACVD, CVD, ion implantation, carburizing, nitriding, boronizing, sulfiding, siliciding, oxidizing, an electrochemical process, an electroless plating process, a thermal spray process, a kinetic spray process, a laser-based process, a friction-stir process, a shot peening process, a laser shock peening process, a welding process, a brazing process, an ultra-fine superpolishing process, a tribochemical polishing process, an electrochemical polishing process, and combinations thereof.

74. The method of claim 51, wherein the one or more buttering layers provide an ultra-smooth surface finish of average surface roughness lower than 0.25 micron.

75. The method of claim 51 wherein at least one of the buttering layers has a minimum hardness of 400 VHN.

76. The method of claim 51, wherein the subterraneous rotary drilling operations are directional including horizontal drilling or extended reach drilling (ERD).

77. The method of claim 76, further including utilizing bent motors or rotary steerable tools during horizontal drilling or extended reach drilling (ERD) to assist with directional control.

78. The method of claim 60, wherein the diamond-like-carbon (DLC) is applied by physical vapor deposition, chemical vapor deposition, or plasma assisted chemical vapor deposition coating techniques.

79. The method of claim 78, wherein the physical vapor deposition coating method is chosen from RF-DC plasma reactive magnetron sputtering, ion beam assisted deposition, cathodic arc deposition and pulsed laser deposition.

80. The method of claim 51, wherein the drill string comprises one or more components chosen from drill pipe, casing, liners, tool joints, transition pipe between the drill string and bottom hole assembly, and combinations thereof.

81. The method of claim 51, wherein the bottom hole assembly comprises one or more components chosen from stabilizers, variable-gauge stabilizers, back reamers, drill collars, flex drill collars, rotary steerable tools, roller reamers, shock subs, mud motors, logging while drilling (LWD) tools, measuring while drilling (MWD) tools, coring tools, underreamers, hole openers, centralizers, turbines, bent housings, bent motors, drilling jars, accelerator jars, crossover subs, bumper jars, torque reduction subs, float subs, fishing tools, fishing jars, washover pipe, logging tools, survey tool subs, non-magnetic counterparts of any of these components, associated external connections of these components, and combinations thereof.

82. The method of claim 51, wherein the dynamic friction coefficient of the ultra-low friction coating is not lower than 50% of the static friction coefficient of the ultra-low friction coating.

83. The method of claim 51, wherein the dynamic friction coefficient of the ultra-low friction coating is greater than or equal to the static friction coefficient of the ultra-low friction coating.

84. The method of claim 51 wherein the downhole temperature during the subterraneous rotary drilling operations ranges from 20 to 400° F.

85. The method of claim 51, wherein the drilling rotary speed at the surface during the subterraneous rotary drilling operations ranges from 0 to 200 RPM.

86. The method of claim 51, wherein the drilling mud pressure during the subterraneous rotary drilling operations ranges from 14 psi to 20,000 psi.

87. The method of claim 51, wherein the ultra-low friction coating provides resistance to torsional vibration instability including stick-slip vibration dysfunction of the drill string and bottom hole assembly.

88. The method of claim 51, wherein the ultra-low friction coating on at least a portion of the exposed outer surface of the body assembly provides resistance to casing wear greater than or equal to that of an uncoated drill stem assembly.

89. The method of claim 88, wherein the ultra-low friction coating on at least a portion of the exposed outer surface of the body assembly provides resistance to casing wear at least 3 times greater than an uncoated drill stem assembly.

90. The method of claim 51, wherein the ultra-low friction coating on at least a portion of the exposed outer surface of the body assembly provides substantial reduction in torque by substantially reducing friction and drag during directional or extended reach drilling facilitating drilling deeper and/or longer reach wells with existing top drive capabilities.

91. The method of claim 51, further comprising applying the ultra-low friction coating on at least a portion of the exposed outer surface of the body assembly at the drilling rig site in the field or at a local supplier shop to apply new or refurbish worn coatings to extend the life and facilitate continued use of the assembly.

92. The method of claim 60, wherein applying the diamond-like-carbon (DLC) ultra-low friction coating includes evacuating at least a portion of the exposed outer surface of the body assembly through a means for mechanical sealing and pumping down prior to vapor deposition coating.

93. The method of claim 51, wherein the utilizing the coated drill stem assembly with coiled tubing in subterraneous rotary drilling operations provides for underbalanced drilling to reach targeted total depth without the need for drag reducing additives in the mud.

94. The method of claim 51, wherein the utilizing the coated drill stem assembly in subterraneous rotary drilling operations provides for substantial friction and drag reduction without compromising the aggressiveness of a drill bit connected to the coated drill stem assembly to transmit applied torque to rock fragmentation process.

95. The method of claim 51, wherein the corrosion resistance of the ultra-low friction coating is at least equal to the steel used for the body assembly.

96. A method for reducing friction in a coated drill stem assembly during subterraneous rotary drilling operations comprising:
    providing a drill stem assembly comprising a body assembly with an exposed outer surface including a drill string coupled to a bottom hole assembly, a coiled tubing coupled to a bottom hole assembly, or a casing string coupled to a bottom hole assembly, an ultra-low friction coating on at least a portion of the body assembly, wherein the ultra-low friction coating comprises one or more ultra-low friction layers, and one or more buttering layers interposed between the body assembly and the ultra-low friction coating, wherein at least one of the buttering layers has a minimum hardness of 400 WIN, and
    utilizing the coated drill stem assembly in subterraneous rotary drilling operations.

97. The method of claim 96 wherein the ultra-low friction coating further comprises one or more buffer layers.

98. The method of claim 96 or claim 97 wherein at least one of the layers is graded, or at least one of an interface between adjacent layers is graded, or combinations thereof.

99. The method of claim 96, wherein the one or more ultra-low friction layers are chosen from an amorphous alloy, an electroless nickel-phosphorous composite, graphite, $MoS_2$, $WS_2$, a fullerene based composite, a boride based cermet, a quasicrystalline material, a diamond based material, diamond-like-carbon (DLC), boron nitride, carbon nanotubes, graphene sheets, metallic particles of high aspect ratio, ring-shaped materials including carbon nanorings, oblong particles, and combinations thereof.

100. The method of claim 99, wherein the diamond based material is chemical vapor deposited (CVD) diamond or polycrystalline diamond compact (PDC).

101. The method of claim 96, wherein at least one ultra-low friction layer is diamond-like-carbon (DLC).

102. The method of claim 101, wherein the diamond-like-carbon (DLC) is chosen from ta-C, ta-C:H, DLCH, PLCH, GLCH, Si-DLC, Ti-DLC, Cr-DLC, N-DLC, O-DLC, B-DLC, Me-DLC, F-DLC, S-DLC, and combinations thereof.

103. The method of claim 96, wherein the ultra-low friction coating provides a surface energy less than 1 $J/m^2$.

104. The method of claim 96, wherein the ultra-low friction coating on at least a portion of the exposed outer surface of the body assembly provides a hardness greater than 400 VHN.

105. The method of claim 96, wherein a coefficient of friction of the coating is less than or equal to 0.15.

106. The method of claim 96, wherein the coating provides at least 3 times greater wear resistance than an uncoated drill stem assembly.

107. The method of claim 96, wherein a water contact angle of the ultra-low friction coating is greater than 60 degrees.

108. The method of claim 96 or 97 wherein a thickness of the ultra-low friction coating ranges from 0.5 microns to 5000 microns.

109. The method of claim 96 or 97 wherein thicknesses of the one or more layers are between 0.001 and 5000 microns.

110. The method of claim 98 wherein thicknesses of the one or more interfaces are between 0.01 to 10 microns or between 5% to 95% of a thickness of the thinnest adjacent layer.

111. The method of claim 97, wherein the one or more buffer layers are chosen from elements, alloys, carbides, nitrides, carbo-nitrides, borides, sulfides, silicides, and oxides of silicon, aluminum, copper, molybdenum, titanium, chromium, tungsten, tantalum, niobium, vanadium, zirconium, hafnium, or combinations thereof.

112. The method of claim 96, wherein one or more exposed outer surfaces further includes hardbanding on at least a portion thereof.

113. The method of claim 112, wherein the hardbanding comprises cermet based materials; metal matrix composites; nanocrystalline metallic alloys; amorphous alloys; hard metallic alloys; carbides, nitrides, borides, or oxides of elemental tungsten, titanium, niobium, molybdenum, iron, chromium, and silicon dispersed within a metallic alloy matrix; or combinations thereof.

114. The method of claim 112 wherein the hardbanding has a patterned surface.

115. The method of claim 114 wherein the patterned hardbanding surface includes recessed and raised features that range from 1 mm to 5 mm in depth.

116. The method of claim 115 wherein the recessed features comprise 10% to 90% of the area in the hardbanding region.

117. The method of claim 114 wherein the hardbanding has a pattern chosen from: lateral grooves or slots, longitudinal grooves or slots, angled grooves or slots, spiral grooves or slots, chevron shaped grooves or slots, recessed dimples, proud dimples, and combinations thereof.

118. The method of claim 96, wherein the one or more buttering layers comprise a stainless steel, a chrome-based alloy, an iron-based alloy, a cobalt-based alloy, a titanium-based alloy, or a nickel-based alloy, alloys or carbides or nitrides or carbo-nitrides or borides or silicides or sulfides or oxides of the following elements: silicon, titanium, chromium, aluminum, copper, iron, nickel, cobalt, molybdenum, tungsten, tantalum, niobium, vanadium, zirconium, hafnium, or combinations thereof.

119. The method of claim 96, wherein the one or more buttering layers is formed by one or more processes chosen from: PVD, PACVD, CVD, carburizing, nitriding, boronizing, sulfiding, siliciding, oxidizing, an electrochemical process, an electroless plating process, a thermal spray process, a kinetic spray process, a laser-based process, a friction-stir process, a shot peening process, a laser shock peening process, a welding process, a brazing process, an ultra-fine super-polishing process, a tribochemical polishing process, an electrochemical polishing process, and combinations thereof.

120. The method of claim 96, wherein the one or more buttering layers provide an ultra-smooth surface finish of average surface roughness lower than 0.25 micron.

121. The method of claim 96, wherein the subterraneous rotary drilling operations are directional including horizontal drilling or extended reach drilling (ERD).

122. The method of claim 121, further including utilizing bent motors or rotary steerable tools during horizontal drilling or extended reach drilling (ERD) to assist with directional control.

123. The method of claim 101, wherein the diamond-like-carbon (DLC) is applied by physical vapor deposition, chemical vapor deposition, or plasma assisted chemical vapor deposition coating techniques.

124. The method of claim 123, wherein the physical vapor deposition coating method is chosen from RF-DC plasma reactive magnetron sputtering, ion beam assisted deposition, cathodic arc deposition and pulsed laser deposition.

125. The method of claim 96, wherein the drill string comprises one or more components chosen from drill pipe, casing, liners, tool joints, transition pipe between the drill string and bottom hole assembly, and combinations thereof.

126. The method of claim 96, wherein the bottom hole assembly comprises one or more components chosen from stabilizers, variable-gauge stabilizers, back reamers, drill collars, flex drill collars, rotary steerable tools, roller reamers, shock subs, mud motors, logging while drilling (LWD) tools, measuring while drilling (MWD) tools, coring tools, under-reamers, hole openers, centralizers, turbines, bent housings, bent motors, drilling jars, accelerator jars, crossover subs, bumper jars, torque reduction subs, float subs, fishing tools, fishing jars, washover pipe, logging tools, survey tool subs, non-magnetic counterparts of any of these components, associated external connections of these components, and combinations thereof.

127. The method of claim 96, wherein the dynamic friction coefficient of the ultra-low friction coating is not lower than 50% of the static friction coefficient of the ultra-low friction coating.

128. The method of claim 96, wherein the dynamic friction coefficient of the ultra-low friction coating is greater than or equal to the static friction coefficient of the ultra-low friction coating.

129. The method of claim 96, wherein the downhole temperature during the subterraneous rotary drilling operations ranges from 20 to 400° F.

130. The method of claim 96, wherein the drilling rotary speed at the surface during the subterraneous rotary drilling operations ranges from 0 to 200 RPM.

131. The method of claim 96, wherein the drilling mud pressure during the subterraneous rotary drilling operations ranges from 14 psi to 20,000 psi.

132. The method of claim 96, wherein the ultra-low friction coating provides resistance to torsional vibration instability including stick-slip vibration dysfunction of the drill string and bottom hole assembly.

133. The method of claim 96, wherein the ultra-low friction coating on at least a portion of the exposed outer surface of the body assembly provides resistance to casing wear greater than or equal to that of an uncoated drill stem assembly.

134. The method of claim 133, wherein the ultra-low friction coating on at least a portion of the exposed outer surface of the body assembly provides resistance to casing wear at least 3 times greater than an uncoated drill stem assembly.

135. The method of claim 96, wherein the ultra-low friction coating on at least a portion of the exposed outer surface of the body assembly provides substantial reduction in torque by substantially reducing friction and drag during directional or extended reach drilling facilitating drilling deeper and/or longer reach wells with existing top drive capabilities.

136. The method of claim 96, further comprising applying the ultra-low friction coating on at least a portion of the exposed outer surface of the body assembly at the drilling rig site in the field or at a local supplier shop to apply new or refurbish worn coatings to extend the life and facilitate continued use of the assembly.

137. The method of claim 101, wherein applying the diamond-like-carbon (DLC) ultra-low friction coating includes evacuating at least a portion of the exposed outer surface of the body assembly through a means for mechanical sealing and pumping down prior to vapor deposition coating.

138. The method of claim 96, wherein the utilizing the coated drill stem assembly with coiled tubing in subterraneous rotary drilling operations provides for underbalanced drilling to reach targeted total depth without the need for drag reducing additives in the mud.

139. The method of claim 96, wherein the utilizing the coated drill stem assembly in subterraneous rotary drilling operations provides for substantial friction and drag reduction without compromising the aggressiveness of a drill bit connected to the coated drill stem assembly to transmit applied torque to rock fragmentation process.

140. The method of claim 96, wherein the corrosion resistance of the ultra-low friction coating is at least equal to the steel used for the body assembly.

\* \* \* \* \*